US012573989B2

(12) United States Patent
 Kogure

(10) Patent No.: US 12,573,989 B2
(45) Date of Patent: Mar. 10, 2026

(54) TRACKER MODULE, POWER AMPLIFIER MODULE, RADIO FREQUENCY MODULE, COMMUNICATION DEVICE, AND RADIO FREQUENCY CIRCUIT

(71) Applicant: Murata Manufacturing Co., Ltd., Nagaokakyo (JP)

(72) Inventor: Takeshi Kogure, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 627 days.

(21) Appl. No.: 18/056,016

(22) Filed: Nov. 16, 2022

(65) Prior Publication Data

US 2023/0072796 A1 Mar. 9, 2023

Related U.S. Application Data

(63) Continuation of application No. PCT/JP2021/018085, filed on May 12, 2021.

(30) Foreign Application Priority Data

May 25, 2020 (JP) ................................. 2020-090956

(51) Int. Cl.
 *H03F 3/24* (2006.01)
(52) U.S. Cl.
 CPC ..................................... *H03F 3/245* (2013.01)
(58) Field of Classification Search
 CPC .... H03F 3/245; H03F 3/195; H03F 2200/171; H03F 2200/102; H03F 2200/417; H03F 2200/451; H03F 1/0227; H04B 1/40
 (Continued)

(56) References Cited

U.S. PATENT DOCUMENTS

| 10,038,414 B2 * | 7/2018 | Ranta | ......................... H03F 3/19 |
| 2009/0224834 A1 * | 9/2009 | Young | ................... H03F 1/0272 |
| | | | 330/296 |

(Continued)

FOREIGN PATENT DOCUMENTS

| JP | 2011176529 A | 9/2011 |
| JP | 2016201787 A | 12/2016 |

(Continued)

OTHER PUBLICATIONS

Wikipedia "Low-pass Filter" (Year: 2025).*
International Search Report in PCT/JP2021/018085, mailed Jul. 13, 2021, 3 pages.

*Primary Examiner* — Andrea Lindgren Baltzell
*Assistant Examiner* — Nareh Shamiryan
(74) *Attorney, Agent, or Firm* — ArentFox Schiff LLP

(57) ABSTRACT

A tracker module is provided that includes an external connection terminal, a tracker, and a variable low pass filter. The external connection terminal is connected to a power amplifier. The tracker supplies a power supply voltage to the power amplifier via the external connection terminal by using an envelope tracking method. The variable low pass filter is disposed on a path between the tracker and the external connection terminal. In the variable low pass filter, a first block includes at least one electronic component. A second block is a block that varies a cutoff frequency of the variable low pass filter. The second block is integrated with the tracker into one package. The first block is disposed separately from the tracker.

19 Claims, 12 Drawing Sheets

(58) Field of Classification Search
USPC ................ 330/297, 136, 279, 127, 199, 255
See application file for complete search history.

(56) References Cited

U.S. PATENT DOCUMENTS

| | | | |
|---|---|---|---|
| 2012/0294201 A1 | 11/2012 | Kurokawa et al. | |
| 2014/0266462 A1 | 9/2014 | Schirmann et al. | |
| 2015/0084698 A1 | 3/2015 | Ito et al. | |
| 2016/0248381 A1* | 8/2016 | Yang ...................... | H03F 3/245 |
| 2016/0301366 A1 | 10/2016 | Sato et al. | |
| 2018/0006618 A1* | 1/2018 | Mohta .................. | H04B 1/0475 |
| 2018/0076772 A1* | 3/2018 | Khesbak .............. | H03G 1/0029 |
| 2018/0302047 A1 | 10/2018 | Garashi et al. | |
| 2020/0228094 A1 | 7/2020 | Kato | |

FOREIGN PATENT DOCUMENTS

| | | |
|---|---|---|
| JP | 2018182720 A | 11/2018 |
| WO | 2013176147 A1 | 11/2013 |
| WO | 2019065027 A1 | 4/2019 |

* cited by examiner

TRACKER MODULE, POWER AMPLIFIER MODULE, RADIO FREQUENCY MODULE, COMMUNICATION DEVICE, AND RADIO FREQUENCY CIRCUIT

CROSS REFERENCE TO RELATED APPLICATIONS

This application is a continuation of PCT Application No. PCT/JP2021/018085, filed May 12, 2021, which claims priority to Japanese Patent Application No. 2020-090956, filed May 25, 2020, the entire contents of each of which are hereby incorporated by reference in their entirety.

FIELD OF THE INVENTION

The present invention generally relates to tracker modules, power amplifier (PA) modules, radio frequency (RF) modules, communication devices, and radio frequency (RF) circuits. More specifically, the present invention relates to a tracker module including a tracker, a PA module including the tracker module, an RF module including the PA module, a communication device including the RF module, and an RF circuit including a tracker circuit.

BACKGROUND

In recent years, PA circuits employing an envelope tracking method (hereinafter referred to as an "ET method") have been known, such as described in International Publication No. 2013/176147, for example. The ET method is an RF amplification technique of changing the amplitude of the power supply voltage for an amplifier element in accordance with the amplitude of the envelope of an RF signal. More specifically, the ET method is a technique of changing the collector voltage of an amplifier element in accordance with an output voltage, thereby reducing power loss generated during operation when the power supply voltage is fixed, and achieving higher efficiency.

The PA circuit described in International Publication No. 2013/176147 includes a transistor that amplifies a signal input to the base and outputs the amplified signal from the collector. The power supply voltage for the transistor is changed in accordance with the amplitude of the envelope of an RF signal, and is supplied to the transistor.

In the PA circuit described in International Publication No. 2013/176147, a low pass filter is connected to a path between a tracker and a PA in order to reduce harmonic components of a power supply voltage from the tracker.

However, in the PA circuit described in International Publication No. 2013/176147, when a common path is used to supply a power supply voltage to a PA supporting a plurality of communication bands, the power supply voltage passes through a low pass filter having the characteristics that are the same in all the communication bands. This presents an issue that it is difficult to achieve both low loss and a favorable attenuation characteristic in some communication bands.

SUMMARY OF THE INVENTION

Accordingly, it is an object of the present invention to provide a tracker module, a power amplifier module, a radio frequency module, a communication device, and a radio frequency circuit that achieve both low loss and a favorable attenuation characteristic in each of a plurality of communication bands.

In an exemplary aspect, a tracker module is provided that includes an external connection terminal, a tracker, and a variable low pass filter. The external connection terminal is connected to a power amplifier. The tracker is configured to supply a power supply voltage to the power amplifier via the external connection terminal by using an envelope tracking method. The variable low pass filter is disposed on a path between the tracker and the external connection terminal. Moreover, the variable low pass filter includes a first block and a second block. The first block includes at least one electronic component and the second block is configured to vary a cutoff frequency of the variable low pass filter. The second block is integrated with the tracker into one package and the first block is disposed separately from the tracker.

In an exemplary aspect, a power amplifier module includes the tracker module and the power amplifier.

In an exemplary aspect, a radio frequency module includes the tracker module, the power amplifier, and a transmission filter that is configured to allow a radio frequency signal amplified by the power amplifier to pass therethrough.

In an exemplary aspect, a communication device includes the radio frequency module and a signal processing circuit that is configured to output a radio frequency signal to the radio frequency module.

In an exemplary aspect, a tracker module includes an external connection terminal, a tracker, and a variable low pass filter. The external connection terminal is connected to a power amplifier. The tracker is configured to supply a power supply voltage to the power amplifier via the external connection terminal. The variable low pass filter is disposed on a path between the tracker and the external connection terminal and includes a switch that is integrated with the tracker into one package.

In an exemplary aspect, a radio frequency circuit includes a tracker circuit and a variable low pass filter. The tracker circuit is configured to supply a power supply voltage to an amplifier circuit by using an envelope tracking method. The variable low pass filter is disposed on a path between the tracker circuit and the amplifier circuit. The variable low pass filter includes a first circuit element and a second circuit element. The second circuit element is different from the first circuit element. The first circuit element is included in the amplifier circuit and the second circuit element is included in the tracker circuit.

With the tracker module, the power amplifier module, the radio frequency module, the communication device, and the radio frequency circuit according to the above exemplary aspects, both low loss and a favorable attenuation characteristic can be achieved in each of a plurality of communication bands.

DETAILED DESCRIPTION OF EMBODIMENTS

Hereinafter, tracker modules according to first to third exemplary embodiments will be described with reference to the drawings. The individual figures referred to in the following embodiments and the like are schematic diagrams. The sizes and thicknesses of the individual components in the figures, and the ratios thereof do not necessarily reflect the actual dimensional ratios.

First Exemplary Embodiment

Tracker Module

The configuration of a tracker module 1 according to the first exemplary embodiment will be described with reference to the drawings.

Figure 1:
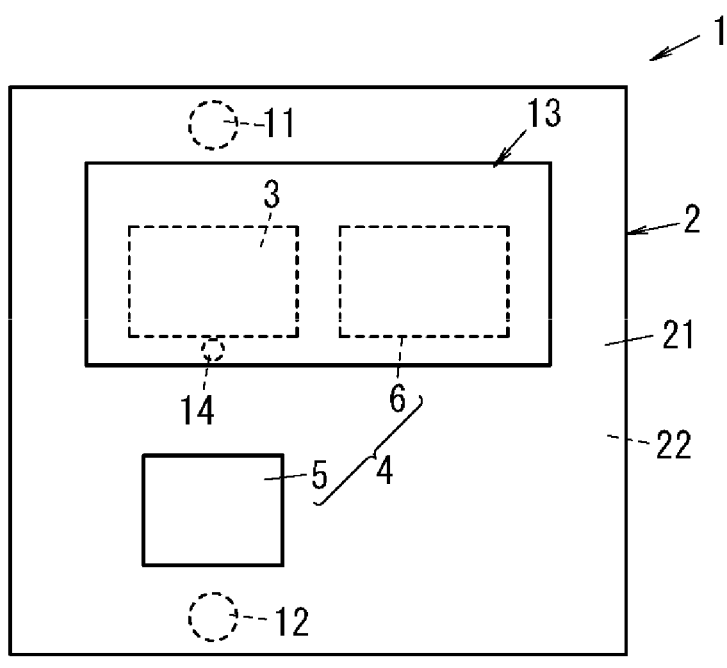
FIG. 1 is a plan view of a tracker module according to a first exemplary embodiment.
Figure 2:
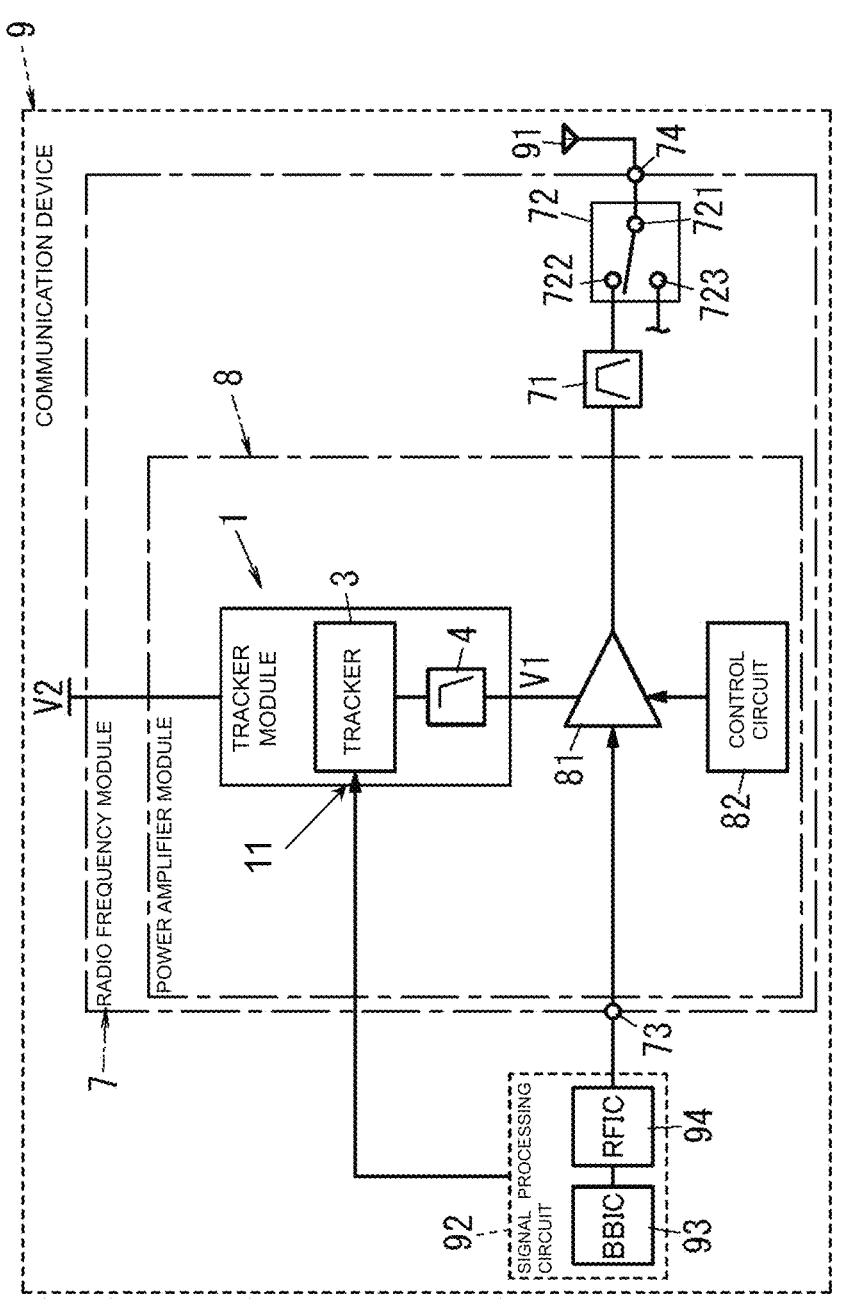
FIG. 2 is a conceptual diagram illustrating the configurations of the tracker module, a power amplifier (PA) module, a radio frequency (RF) module, and a communication device according to the first exemplary embodiment.

As illustrated in FIG. 1 and FIG. 2, the tracker module 1 includes a substrate 2, a tracker 3, and a variable low pass filter 4. The tracker module 1 also includes an input terminal 11, an external connection terminal 12, and an output terminal 14. The tracker module 1 is connected to, for example, a battery (not illustrated) of a terminal or the like equipped with a radio frequency (RF) module 7, and is supplied with a battery voltage V2 from the battery.

The tracker module 1 has a configuration in which the single tracker 3 supports a plurality of communication bands. More specifically, the tracker module 1 has a configuration in which the single tracker 3 supplies a power supply voltage V1 to a power amplifier (PA) 81 that amplifies transmission signals of a plurality of communication bands.

(2) RF Module

Next, the RF module 7 including the tracker module 1 will be described with reference to the drawings.

As illustrated in FIG. 2, the RF module 7 includes a PA module 8 including the tracker module 1, a filter 71, a switch 72, an input terminal 73, and an antenna terminal 74. An RF signal output from the RF module 7 is transmitted to a base station (not illustrated) via an antenna 91, which will be described below. Moreover, the RF module 7 is used for a communication device 9 or the like, which will be described below.

(3) Communication Device

Next, the communication device 9 including the RF module 7 will be described with reference to the drawings.

As illustrated in FIG. 2, the communication device 9 includes the RF module 7, the antenna 91, and a signal processing circuit 92. The communication device 9 corresponds to user equipment (UE) in a cellular network, and is typically a mobile phone, a smartphone, a tablet computer, a wearable device, or the like. In exemplary aspects, the communication device 9 may be an Internet of Things (IoT) sensor device, a medical/health-care device, a vehicle, an unmanned aerial vehicle (UAV) (a so-called drone), or an automated guided vehicle (AGV).

To amplify an RF signal, an envelope tracking method (hereinafter referred to as an "ET method") is used herein. The ET method includes an analog envelope tracking method (hereinafter referred to as an "analog ET method") and a digital envelope tracking method (hereinafter referred to as a "digital ET method").

The analog ET method is a method of continuously assigning the amplitude level of the power supply voltage for an amplifier element in accordance with the envelope of the amplitude of an RF signal input to the amplifier element. In the analog ET method, the envelope is continuously detected, and thus the amplitude level of the power supply voltage continuously changes.

The digital ET method is a method of discretely supplying power supply voltages in amplitude levels to an amplifier element in accordance with the envelope of the amplitude of an RF signal input to the amplifier element. In the digital ET method, the voltage level of the power supply voltage is selected from among a plurality of discrete voltage levels in response to a digital control signal corresponding to an envelope signal, and changes with time. The envelope signal is a signal indicating the envelope value of a modulated wave (e.g., an RF signal). The envelope value is, for example, $(I^2+Q^2)^{1/2}$. (I, Q) represents a constellation point herein. The constellation point is a point representing, on a constellation diagram, a signal modulated by digital modulation.

(4) Individual Components of Tracker Module

Hereinafter, the individual components of the tracker module 1 according to the first embodiment will be described with reference to the drawings.

(4.1) Substrate

The substrate 2 illustrated in FIG. 1 is a substrate different from a substrate on or in which the PA 81 (see FIG. 2) is disposed. As illustrated in FIG. 1, the substrate 2 has a first main surface 21 (e.g., one main surface) and a second main surface 22. The first main surface 21 and the second main surface 22 face each other in the thickness direction of the substrate 2, such that they are opposite each other.

(4.2) Input Terminal, External Connection Terminal, Output Terminal

Figure 3:
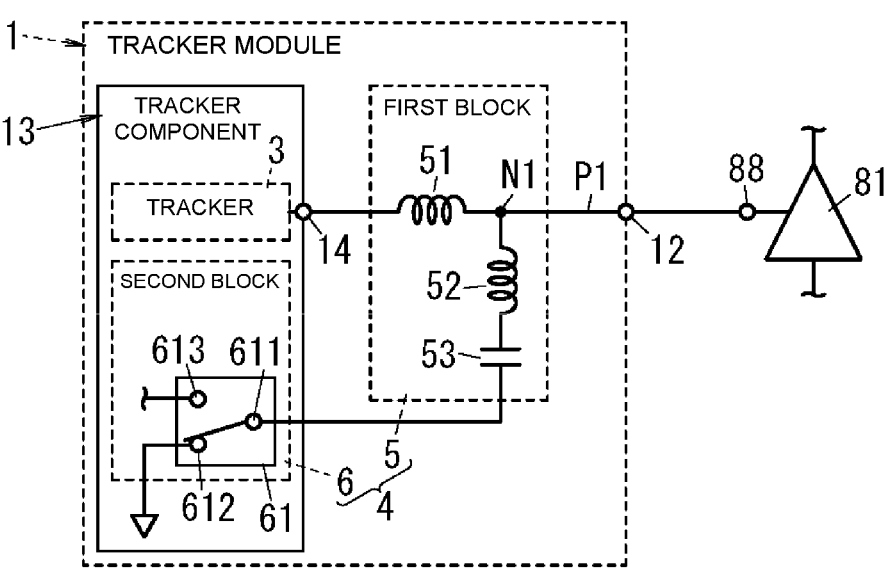
FIG. 3 is a conceptual diagram illustrating a main part of the tracker module according to the first exemplary embodiment.

As illustrated in FIG. 1 and FIG. 2, the input terminal 11 is connected to the signal processing circuit 92, and receives a power supply control signal from the signal processing circuit 92. As illustrated in FIG. 1 and FIG. 3, the external connection terminal 12 is connected to the PA 81. More specifically, the external connection terminal 12 is connected to a terminal 88 of the PA 81. As illustrated in FIG. 1, the output terminal 14 is integrated with the tracker 3 into one package. The variable low pass filter 4 is connected to the output terminal 14.

(4.3) Tracker

As illustrated in FIG. 2, the tracker 3 is configured to supply the power supply voltage V1 to the PA 81. More specifically, the tracker 3 generates the power supply voltage V1 having a level corresponding to an envelope extracted from a modulated signal of an RF signal, and supplies the power supply voltage V1 to the PA 81.

The tracker 3 includes an input terminal (not illustrated) that receives a power supply control signal. The input terminal is connected to the signal processing circuit 92 and receives a power supply control signal from the signal processing circuit 92. Moreover, the tracker 3 generates the power supply voltage V1 in response to the power supply control signal received by the input terminal. At this time, the tracker 3 changes the amplitude of the power supply voltage V1 in response to the power supply control signal from the signal processing circuit 92. In other words, the tracker 3 is an envelope tracking circuit that generates the power supply voltage V1 that varies in accordance with the envelope of the amplitude of an RF signal output from the signal processing circuit 92. The tracker 3 includes, for example, a direct current (DC)-DC converter, detects the amplitude level of the RF signal from an I-phase signal and a Q-phase signal, and generates the power supply voltage V1 by using the detected amplitude level.

Accordingly, the tracker 3 is configured to supply the power supply voltage V1 to the PA 81 via the external connection terminal 12 by using the ET method.

(4.4) Variable Low Pass Filter

As illustrated in FIG. 3, the variable low pass filter 4 is disposed on a path P1 between the tracker 3 and the PA 81. More specifically, the variable low pass filter 4 is disposed on the path P1 between the tracker 3 and the external connection terminal 12. The variable low pass filter 4 reduces harmonic components of the power supply voltage V1. Accordingly, noise resulting from the power supply voltage V1 can be reduced.

As illustrated in FIG. 3, the variable low pass filter 4 includes a first block 5 and a second block 6. The variable low pass filter 4 is a so-called LC filter including an inductor and a capacitor as main components.

According to the exemplary aspect, the first block 5 includes at least one electronic component. More specifically, the first block 5 includes two inductors 51 and 52 and a capacitor 53. The inductor 51 is disposed on the path P1 between the tracker 3 and the external connection terminal 12. The inductor 52 is connected to a node N1 on the path P1. The capacitor 53 is connected in series to the inductor 52.

The second block 6 is a block for varying the cutoff frequency, that is, the attenuation pole, of the variable low pass filter 4. In the first embodiment, the second block 6 includes a switch 61. As further shown, the switch 61 has a common terminal 611 and a plurality of (two in the illustrated example) selection terminals 612 and 613. The common terminal 611 is connected to the capacitor 53. The selection terminal 612 is connected to the ground. The selection terminal 613 is connected to nothing, that is, open. The cutoff frequency of the variable low pass filter 4 varies according to the magnitude of the reactance (inductance, capacitance) of the variable low pass filter 4. Here, the cutoff frequency of the variable low pass filter 4 is varied by varying the reactance (at least one of the inductance and the capacitance) of the second block 6.

The second block 6 is integrated with the tracker 3 into one package. Specifically, the tracker 3 and the second block 6 form a tracker component (tracker integrated circuit (IC)) 13.

The variable low pass filter 4 operates as a filter when the common terminal 611 is connected to the selection terminal 612 in the switch 61 of the second block 6. On the other hand, when the common terminal 611 of the switch 61 is connected to the selection terminal 613, the variable low pass filter 4 does not operate as a filter.

(4.5) Disposition Relationship Among Tracker, Variable Low Pass Filter, and External Connection Terminal In the tracker module 1 described above, the tracker 3 and the second block 6 of the variable low pass filter 4 are disposed on or in the substrate 2, as illustrated in FIG. 1. More specifically, the tracker 3 and the variable low pass filter 4 are disposed on the first main surface 21 of the substrate 2. On the other hand, the external connection terminal 12 is disposed on the second main surface 22 of the substrate 2.

In addition, the first block 5 of the variable low pass filter 4 is disposed separately from the tracker 3. For purposes of this disclosure, the phrase "the first block 5 is disposed separately from the tracker 3" means that the first block 5 and the tracker 3 are not integrated into one package, and means that the first block 5 and the tracker 3 are separately packaged in different housings.

In the first embodiment, the tracker component 13 including the tracker 3 is disposed adjacent to the first block 5 of the variable low pass filter 4 on or in the substrate 2. More specifically, at least one of the plurality of electronic components included in the first block 5 (the inductors 51 and 52 and the capacitor 53) is disposed adjacent to the tracker 3. In addition, for purposes of this disclosure, the phrase "at least one of the plurality of electronic components included in the first block 5 is disposed adjacent to the tracker 3" means that at least one of the plurality of electronic components is disposed on or in the substrate 2 in a state in which no other electronic components are disposed between the at least one of the plurality of electronic components and the tracker 3 on or in the substrate 2.

On the other hand, as described above, the tracker 3 and the second block 6 of the variable low pass filter 4 are integrated into one package to serve as the tracker component 13.

As described above, the tracker component 13 includes the tracker 3, the output terminal 14, and the second block 6 of the variable low pass filter 4. The tracker 3 supplies the power supply voltage V1 to the PA 81 by using the ET method. The output terminal 14 is connected to the tracker 3. The second block 6 is a block for varying the cutoff frequency of the variable low pass filter 4. The tracker 3 is disposed separately from the first block 5. The second block 6 and the tracker 3 are integrated into one package.

(5) Details of Tracker Module

Next, the tracker module 1 according to the first exemplary embodiment will be described in detail with reference to FIG. 5 and FIG. 6.

Figure 5:
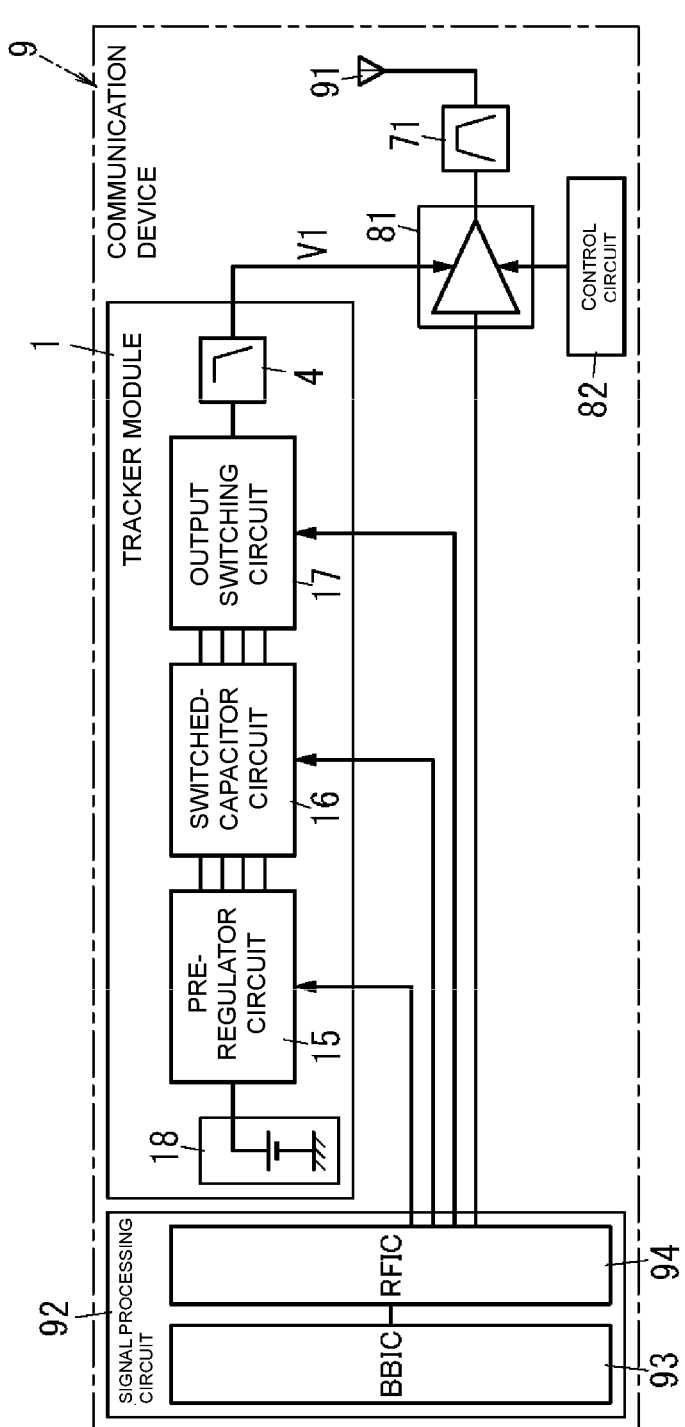
FIG. 5 is a conceptual diagram illustrating the configuration of the communication device according to the first exemplary embodiment.
Figure 6:
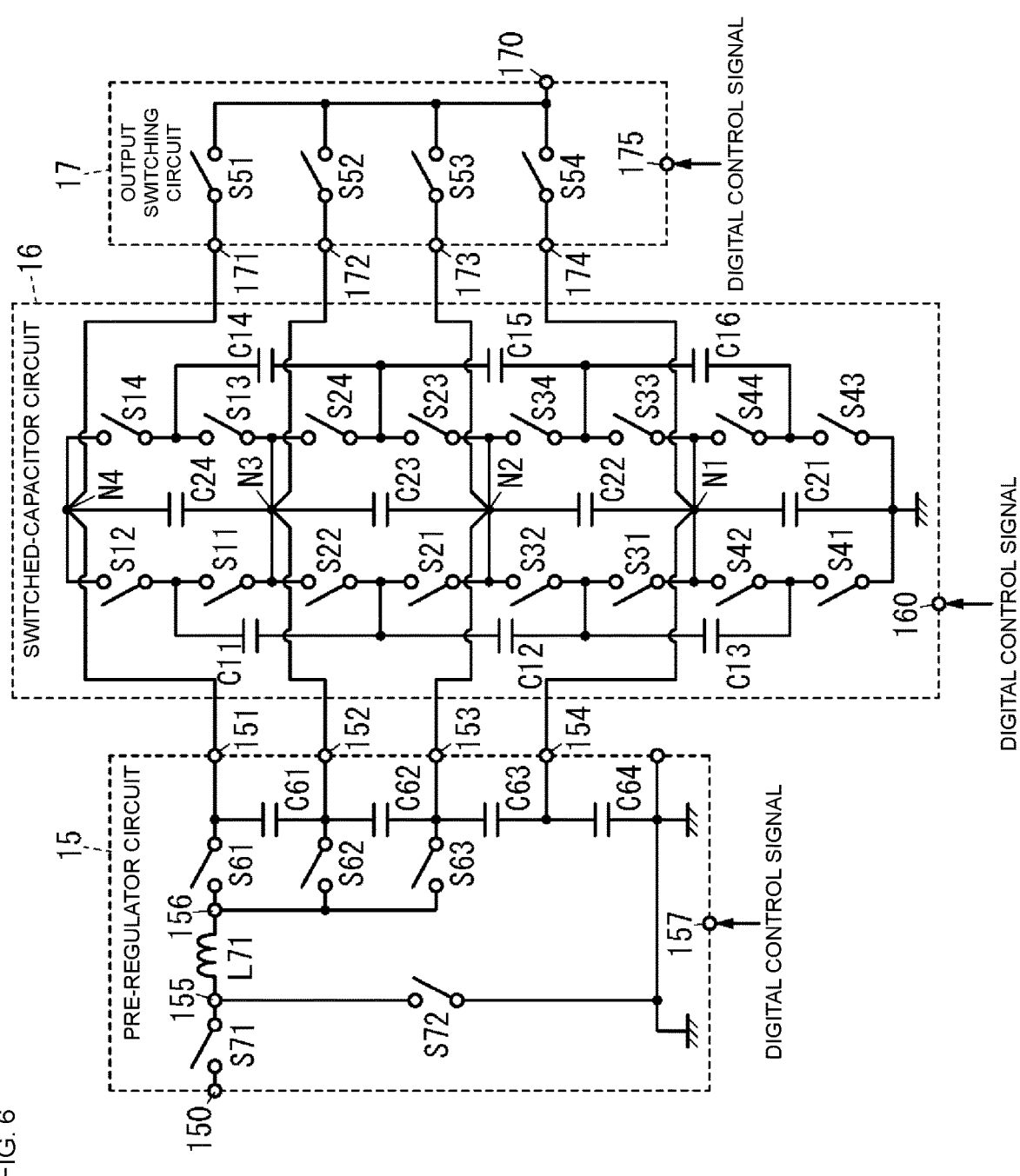
FIG. 6 is a conceptual diagram illustrating the configuration of a tracker according to the first exemplary embodiment.

As illustrated in FIG. 5 and FIG. 6, the tracker module 1 includes a pre-regulator circuit 15, a switched-capacitor circuit 16, an output switching circuit 17, and a DC power supply 18.

The tracker module 1 supplies the PA 81 with the power supply voltage V1 having a power supply voltage level selected from among a plurality of discrete voltage levels in response to an envelope signal.

The pre-regulator circuit 15 includes a power inductor and switches. The power inductor is an inductor used to raise and/or lower (raise, lower, or raise and lower) a DC voltage. The power inductor is disposed in series in a DC path. The pre-regulator circuit 15 converts a voltage by using the power inductor. The pre-regulator circuit 15 may also be referred to as a magnetic regulator or a DC-DC converter. Alternatively, the power inductor may be connected between a series-arm path and the ground (e.g., disposed in parallel).

It is noted that the pre-regulator circuit 15 does not necessarily need to include the power inductor, and may be, for example, a circuit or the like that raises and/or lowers (raises, lowers, or raises and lowers) a voltage by switching between capacitors disposed on the series-arm path and a parallel-arm path of the pre-regulator circuit 15.

The switched-capacitor circuit 16 includes a plurality of capacitors and a plurality of switches, and is configured for generating a plurality of voltages respectively having a plurality of discrete voltage levels from the voltage output from the pre-regulator circuit 15. The switched-capacitor circuit 16 may also be referred to as a switched-capacitor voltage balancer.

The output switching circuit 17 selects, in response to a digital control signal corresponding to an envelope signal, at least one of the plurality of voltages generated by the switched-capacitor circuit 16, and outputs the selected voltage to the variable low pass filter 4.

The DC power supply 18 supplies a DC voltage to the pre-regulator circuit 15. The DC power supply 18 may be, and is not limited to, a rechargeable battery, for example.

It is also noted that the tracker module 1 does not necessarily need to include at least one of the pre-regulator circuit 15 and the DC power supply 18. For example, the tracker module 1 does not necessarily need to include the DC power supply 18. Any combination of the pre-regulator circuit 15, the switched-capacitor circuit 16, and the output switching circuit 17 may be integrated into a single circuit. A detailed circuit configuration example of the tracker module 1 will be described below with reference to FIG. 6.

(5.1) Circuit Configuration of Tracker Module

Next, the circuit configurations of the pre-regulator circuit 15, the switched-capacitor circuit 16, and the output switching circuit 17 included in the tracker module 1 will be described with reference to FIG. 6.

FIG. 6 illustrates an exemplary circuit configuration. It is noted that the pre-regulator circuit 15, the switched-capacitor circuit 16, and the output switching circuit 17 can be mounted by using any one of a wide variety of circuit packaging methods and circuit techniques. Thus, the description of the individual circuits provided below should not be construed in a limiting manner.

(5.2) Switched-Capacitor Circuit

As illustrated in FIG. 6, the switched-capacitor circuit 16 includes a plurality of (e.g., six in the illustrated example) capacitors C11 to C16, a plurality of (e.g., four in the illustrated example) capacitors C21 to C24, a plurality of (e.g., sixteen in the illustrated example) switches S11 to S14, S21 to S24, S31 to S34, and S41 to S44, and a control terminal 160.

The control terminal 160 is an input terminal for a digital control signal. More specifically, the control terminal 160 is a terminal for receiving a digital control signal for controlling the switched-capacitor circuit 16. The digital control signal received via the control terminal 160 is, for example, a control signal of a source synchronous scheme in which a data signal and a clock signal are transmitted. It is also noted that the digital control signal is not limited to the control signal of the source synchronous scheme. For example, the digital control signal can be a control signal of a clock embedded scheme.

The plurality of capacitors C11 to C16 each function as a flying capacitor (e.g., a transfer capacitor). That is, the plurality of capacitors C11 to C16 are each used to raise or lower the voltage supplied from the pre-regulator circuit 15. More specifically, the plurality of capacitors C11 to C16 cause electric charges to move between the capacitors C11 to C16 and nodes N1 to N4 so that voltages V41 to V44 (e.g., voltages with respect to the ground potential) satisfying V41:V42:V43:V44=1:2:3:4 are maintained at the four nodes N1 to N4. The plurality of voltages V41 to V44 correspond to a plurality of voltages respectively having a plurality of discrete voltage levels. The voltage V41 is the voltage at the node N1, the voltage V42 is the voltage at the node N2, the voltage V43 is the voltage at the node N3, and the voltage V44 is the voltage at the node N4.

The capacitor C11 has two electrodes (e.g., a first electrode and a second electrode). One of the two electrodes (first electrode) of the capacitor C11 is connected to one terminal (first terminal) of the switch S11 and one terminal (first terminal) of the switch S12. The other of the two electrodes (second electrode) of the capacitor C11 is connected to one terminal (first terminal) of the switch S21 and one terminal (first terminal) of the switch S22.

The capacitor C12 has two electrodes (e.g., a first electrode and a second electrode). One of the two electrodes (first electrode) of the capacitor C12 is connected to the one terminal (first terminal) of the switch S21 and the one terminal (first terminal) of the switch S22. The other of the two electrodes (second electrode) of the capacitor C12 is connected to one terminal (first terminal) of the switch S31 and one terminal (first terminal) of the switch S32.

The capacitor C13 has two electrodes (e.g., a first electrode and a second electrode). One of the two electrodes (first electrode) of the capacitor C13 is connected to the one terminal (first terminal) of the switch S31 and the one terminal (first terminal) of the switch S32. The other of the two electrodes (second electrode) of the capacitor C13 is connected to one terminal (first terminal) of the switch S41 and one terminal (first terminal) of the switch S42.

The capacitor C14 has two electrodes (e.g., a first electrode and a second electrode). One of the two electrodes (first electrode) of the capacitor C14 is connected to one terminal (first terminal) of the switch S13 and one terminal (first terminal) of the switch S14. The other of the two electrodes (second electrode) of the capacitor C14 is connected to one terminal (first terminal) of the switch S23 and one terminal (first terminal) of the switch S24.

The capacitor C15 has two electrodes (e.g., a first electrode and a second electrode). One of the two electrodes (first electrode) of the capacitor C15 is connected to the one terminal (first terminal) of the switch S23 and the one terminal (first terminal) of the switch S24. The other of the two electrodes (second electrode) of the capacitor C15 is connected to one terminal (first terminal) of the switch S33 and one terminal (first terminal) of the switch S34.

The capacitor C16 has two electrodes (e.g., a first electrode and a second electrode). One of the two electrodes (first electrode) of the capacitor C16 is connected to the one terminal (first terminal) of the switch S33 and the one terminal (first terminal) of the switch S34. The other of the two electrodes (second electrode) of the capacitor C16 is connected to one terminal (first terminal) of the switch S43 and one terminal (first terminal) of the switch S44.

Moreover, in operation, a set of the capacitors C11 and C14, a set of the capacitors C12 and C15, and a set of the capacitors C13 and C16 can each be charged and discharged in a complementary manner as a result of the following first phase and second phase being repeated.

Specifically, in the first phase, the switches S12, S13, S22, S23, S32, S33, S42, and S43 are turned ON. Accordingly, for example, the one of the two electrodes (first electrode) of the capacitor C12 is connected to the node N3, the other of the two electrodes (second electrode) of the capacitor C12 and the one of the two electrodes (first electrode) of the capacitor C15 are connected to the node N2, and the other of the two electrodes (second electrode) of the capacitor C15 is connected to the node N1.

On the other hand, in the second phase, the switches S11, S14, S21, S24, S31, S34, S41, and S44 are turned ON. Accordingly, for example, the one of the two electrodes (first electrode) of the capacitor C15 is connected to the node N3, the other of the two electrodes (second electrode) of the capacitor C15 and the one of the two electrodes (first electrode) of the capacitor C12 are connected to the node N2, and the other of the two electrodes (second electrode) of the capacitor C12 is connected to the node N1.

As a result of the first phase and the second phase being repeated, for example, when one of the capacitors C12 and C15 is charged through the node N2, the other of the capacitors C12 and C15 can be discharged to the capacitor C23. In short, the capacitors C12 and C15 can be charged and discharged in a complementary manner. The capacitors C12 and C15 serve as a pair of flying capacitors that are charged and discharged in a complementary manner.

Similarly to the set of the capacitors C12 and C15, a set of any one of the capacitors C11 to C13 and any one of the capacitors C14 to C16 also serves as a pair of flying capacitors that are charged through a node and discharged to a smoothing capacitor in a complementary manner as a result of appropriate switching.

In addition, the plurality of capacitors C21 to C24 each function as a smoothing capacitor. Specifically, the capacitors C21 to C24 are used to hold and smooth the voltages V41 to V44 at the nodes N1 to N4.

The capacitor C21 is connected between the node N1 and the ground. Specifically, one of the two electrodes (first electrode) of the capacitor C21 is connected to the node N1. On the other hand, the other of the two electrodes (second electrode) of the capacitor C21 is connected to the ground.

The capacitor C22 is connected between the node N2 and the node N1. Specifically, one of the two electrodes (first electrode) of the capacitor C22 is connected to the node N2. On the other hand, the other of the two electrodes (second electrode) of the capacitor C22 is connected to the node N1.

The capacitor C23 is connected between the node N3 and the node N2. Specifically, one of the two electrodes (first electrode) of the capacitor C23 is connected to the node N3. On the other hand, the other of the two electrodes (second electrode) of the capacitor C23 is connected to the node N2.

The capacitor C24 is connected between the node N4 and the node N3. Specifically, one of the two electrodes (first electrode) of the capacitor C24 is connected to the node N4. On the other hand, the other of the two electrodes (second electrode) of the capacitor C24 is connected to the node N3.

The switch S11 is connected between the one of the two electrodes (first electrode) of the capacitor C11 and the node N3. Specifically, the one terminal (first terminal) of the switch S11 is connected to the one of the two electrodes of the capacitor C11. On the other hand, the other terminal (second terminal) of the switch S11 is connected to the node N3.

The switch S12 is connected between the one of the two electrodes (first electrode) of the capacitor C11 and the node N4. Specifically, the one terminal (first terminal) of the switch S12 is connected to the one of the two electrodes of the capacitor C11. On the other hand, the other terminal (second terminal) of the switch S12 is connected to the node N4.

The switch S21 is connected between the one of the two electrodes (first electrode) of the capacitor C12 and the node N2. Specifically, the one terminal (first terminal) of the switch S21 is connected to the one of the two electrodes of the capacitor C12 and the other of the two electrodes (second electrode) of the capacitor C11. On the other hand, the other terminal (second terminal) of the switch S21 is connected to the node N2.

Similarly, the switch S22 is connected between the one of the two electrodes (first electrode) of the capacitor C12 and the node N3. Specifically, the one terminal (first terminal) of the switch S22 is connected to the one of the two electrodes of the capacitor C12 and the other of the two electrodes (second electrode) of the capacitor C11. On the other hand, the other terminal (second terminal) of the switch S22 is connected to the node N3.

In addition, the switch S31 is connected between the other of the two electrodes (second electrode) of the capacitor C12 and the node N1. Specifically, the one terminal (first terminal) of the switch S31 is connected to the other of the two electrodes of the capacitor C12 and the one of the two electrodes (first electrode) of the capacitor C13. On the other hand, the other terminal (second terminal) of the switch S31 is connected to the node N1.

Likewise, the switch S32 is connected between the other of the two electrodes (second electrode) of the capacitor C12 and the node N2. Specifically, the one terminal (first terminal) of the switch S32 is connected to the other of the two electrodes of the capacitor C12 and the one of the two electrodes (first electrode) of the capacitor C13. On the other hand, the other terminal (second terminal) of the switch S32 is connected to the node N2. That is, the other terminal of the switch S32 is connected to the other terminal (second terminal) of the switch S21.

The switch S41 is connected between the other of the two electrodes (second electrode) of the capacitor C13 and the ground. Specifically, the one terminal (first terminal) of the switch S41 is connected to the other of the two electrodes (second electrode) of the capacitor C13. On the other hand, the other terminal (second terminal) of the switch S41 is connected to the ground.

The switch S42 is connected between the other of the two electrodes (second electrode) of the capacitor C13 and the node N1. Specifically, the one terminal (first terminal) of the switch S42 is connected to the other of the two electrodes (second electrode) of the capacitor C13. On the other hand, the other terminal (second terminal) of the switch S42 is connected to the node N1. That is, the other terminal of the switch S42 is connected to the other terminal (second terminal) of the switch S31.

The switch S13 is connected between the one of the two electrodes (first electrode) of the capacitor C14 and the node N3. Specifically, the one terminal (first terminal) of the switch S13 is connected to the one of the two electrodes (first electrode) of the capacitor C14. On the other hand, the other terminal (second terminal) of the switch S13 is connected to the node N3. That is, the other terminal of the switch S13 is connected to the other terminal (second terminal) of the switch S11 and the other terminal (second terminal) of the switch S22.

The switch S14 is connected between the one of the two electrodes (first electrode) of the capacitor C14 and the node N4. Specifically, the one terminal (first terminal) of the switch S14 is connected to the one of the two electrodes (first electrode) of the capacitor C14. On the other hand, the other terminal (second terminal) of the switch S14 is connected to the node N4. That is, the other terminal of the switch S14 is connected to the other terminal (second terminal) of the switch S12.

The switch S23 is connected between the one of the two electrodes (first electrode) of the capacitor C15 and the node N2. Specifically, the one terminal (first terminal) of the switch S23 is connected to the one of the two electrodes (first electrode) of the capacitor C15 and the other of the two electrodes (second electrode) of the capacitor C14. On the other hand, the other terminal (second terminal) of the switch S23 is connected to the node N2. That is, the other terminal of the switch S23 is connected to the other terminal (second terminal) of the switch S21 and the other terminal (second terminal) of the switch S32.

The switch S24 is connected between the one of the two electrodes (first electrode) of the capacitor C15 and the node N3. Specifically, the one terminal (first terminal) of the switch S24 is connected to the one of the two electrodes (first electrode) of the capacitor C15 and the other of the two electrodes (second electrode) of the capacitor C14. On the other hand, the other terminal (second terminal) of the switch S24 is connected to the node N3. That is, the other terminal of the switch S24 is connected to the other terminal (second terminal) of the switch S11, the other terminal (second terminal) of the switch S22, and the other terminal (second terminal) of the switch S13.

The switch S33 is connected between the other of the two electrodes (second electrode) of the capacitor C15 and the node N1. Specifically, the one terminal (first terminal) of the switch S33 is connected to the other of the two electrodes (second electrode) of the capacitor C15 and the one of the two electrodes (first electrode) of the capacitor C16. On the other hand, the other terminal (second terminal) of the switch S33 is connected to the node N1. That is, the other terminal of the switch S33 is connected to the other terminal (second terminal) of the switch S31 and the other terminal (second terminal) of the switch S42.

The switch S34 is connected between the other of the two electrodes (second electrode) of the capacitor C15 and the node N2. Specifically, the one terminal (first terminal) of the switch S34 is connected to the other of the two electrodes (second electrode) of the capacitor C15 and the one of the two electrodes (first electrode) of the capacitor C16. On the other hand, the other terminal (second terminal) of the switch S34 is connected to the node N2. That is, the other terminal of the switch S34 is connected to the other terminal (second terminal) of the switch S21, the other terminal (second terminal) of the switch S32, and the other terminal (second terminal) of the switch S23.

The switch S43 is connected between the other of the two electrodes (second electrode) of the capacitor C16 and the ground. Specifically, the one terminal (first terminal) of the switch S43 is connected to the other of the two electrodes (second electrode) of the capacitor C16. On the other hand, the other terminal (second terminal) of the switch S43 is connected to the ground.

The switch S44 is connected between the other of the two electrodes (second electrode) of the capacitor C16 and the node N1. Specifically, the one terminal (first terminal) of the switch S44 is connected to the other of the two electrodes (second electrode) of the capacitor C16. On the other hand, the other terminal (second terminal) of the switch S44 is connected to the node N1. That is, the other terminal of the switch S44 is connected to the other terminal (second terminal) of the switch S31, the other terminal (second terminal) of the switch S42, and the other terminal (second terminal) of the switch S33.

In operation, a first set of switches including the switches S12, S13, S22, S23, S32, S33, S42, and S43, and a second set of switches including the switches S11, S14, S21, S24, S31, S34, S41, and S44 are turned ON and OFF in a complementary manner. Specifically, in the first phase, the switches in the first set are turned ON whereas the switches in the second set are turned OFF. Conversely, in the second phase, the switches in the first set are turned OFF whereas the switches in the second set are turned ON.

For example, in one of the first phase and the second phase, charging from the capacitors C11 to C13 to the capacitors C21 to C24 is performed, and in the other of the first phase and the second phase, charging from the capacitors C14 to C16 to the capacitors C21 to C24 is performed. In other words, because the capacitors C21 to C24 are constantly charged by the capacitors C11 to C13 or the capacitors C14 to C16, the nodes N1 to N4 are rapidly replenished with electric charges even if currents rapidly flow from the nodes N1 to N4 to the output switching circuit 17. Thus, potential variations at the nodes N1 to N4 can be suppressed.

As a result of operating in the above-described manner, the switched-capacitor circuit 16 is configured to maintain substantially equal voltages across each of the capacitors C21 to C24. Specifically, the voltages V41 to V44 (voltages with respect to the ground potential) satisfying V41:V42:V43:V44=1:2:3:4 are maintained at the four nodes N1 to N4. The levels of the voltages V41 to V44 correspond to a plurality of discrete voltage levels supplied to the output switching circuit 17 by the switched-capacitor circuit 16.

The voltage ratio V41:V42:V43:V44 is not limited to 1:2:3:4. For example, the voltage ratio V41:V42:V43:V44 may be 1:2:4:8.

The configuration of the switched-capacitor circuit 16 illustrated in FIG. 6 is an example. The configuration of the switched-capacitor circuit 16 is not limited to the configuration illustrated in FIG. 6. In FIG. 6, the switched-capacitor circuit 16 is configured to supply voltages of four discrete voltage levels, but it is noted that the configuration thereof is not limited to the configuration of supplying voltages of four discrete voltage levels. For example, the switched-capacitor circuit 16 can be configured to supply voltages of any number of two or more discrete voltage levels. For example, in a case where voltages of two discrete voltage levels are supplied, it is sufficient that the switched-capacitor circuit 16 include at least the capacitors C12 and C15 and the switches S21, S22, S31, S32, S23, S24, S33, and S34.

The switches included in the switched-capacitor circuit 16 are included in the tracker 3 in the exemplary aspect. Specifically, the tracker 3 includes the plurality of switches S11 to S14, S21 to S24, S31 to S34, and S41 to S44.

(5.3) Output Switching Circuit

Hereinafter, the circuit configuration of the output switching circuit 17 will be described. As illustrated in FIG. 6, the output switching circuit 17 includes a plurality of (four in the illustrated example) input terminals 171 to 174, a plurality of (four in the illustrated example) switches S51 to S54, an output terminal 170, and a control terminal 175.

The output terminal 170 is connected to the variable low pass filter 4 as shown in FIG. 5, for example. The output terminal 170 is a terminal for supplying the variable low pass filter 4 with a voltage selected from among the voltages V41 to V44.

The plurality of input terminals 171 to 174 are connected to the nodes N4 to N1 of the switched-capacitor circuit 16, respectively. The plurality of input terminals 171 to 174 are terminals for receiving the voltages V44 to V41 from the switched-capacitor circuit 16, respectively.

The control terminal 175 is an input terminal for a digital control signal. Specifically, the control terminal 175 is a terminal for receiving a digital control signal indicating one of the voltages V41 to V44. The output switching circuit 17 controls ON/OFF of the plurality of switches S51 to S54 so as to select a voltage level indicated by the digital control signal.

The digital control signal received via the control terminal 175 includes, for example, two digital control logic/line (DCL) signals. The two DCL signals are each a 1-bit signal. One of the voltages V41 to V44 is indicated by a combination of the two 1-bit signals. For example, the voltages V41, V42, V43, and V44 are indicated by "00", "01", "10", and "11", respectively. A gray code may be used to express a voltage level. In the above case, two control terminals are provided to receive the two DCL signals. The number of DCL signals may be any number greater than or equal to one in accordance with the number of voltage levels. The DCL signal may be a signal of two or more bits. The digital control signal may be one or more DCL signals, or may be a control signal of the source synchronous scheme.

The switch S51 is connected between the input terminal 171 and the output terminal 170. Specifically, the switch S51 has a first terminal connected to the input terminal 171 and a second terminal connected to the output terminal 170. In this connection configuration, ON/OFF switching of the switch S51 enables switching between connection and disconnection between the input terminal 171 and the output terminal 170.

The switch S52 is connected between the input terminal 172 and the output terminal 170. Specifically, the switch S52 has a first terminal connected to the input terminal 172 and a second terminal connected to the output terminal 170. In this connection configuration, ON/OFF switching of the switch S52 enables switching between connection and disconnection between the input terminal 172 and the output terminal 170.

The switch S53 is connected between the input terminal 173 and the output terminal 170. Specifically, the switch S53 has a first terminal connected to the input terminal 173 and a second terminal connected to the output terminal 170. In this connection configuration, ON/OFF switching of the switch S53 enables switching between connection and disconnection between the input terminal 173 and the output terminal 170.

Moreover, the switch S54 is connected between the input terminal 174 and the output terminal 170. Specifically, the switch S54 has a first terminal connected to the input terminal 174 and a second terminal connected to the output terminal 170. In this connection configuration, ON/OFF switching of the switch S54 enables switching between connection and disconnection between the input terminal 174 and the output terminal 170.

The plurality of switches S51 to S54 are controlled so as to be exclusively turned ON in an exemplary aspect. In other words, only any one of the switches S51 to S54 is turned ON, and the others are turned OFF. Accordingly, the output switching circuit 17 is configured to output one voltage selected from among the voltages V41 to V44.

With the above-described configuration, the output switching circuit 17 receives a digital control signal corresponding to an envelope signal through the control terminal 175, controls ON/OFF of the plurality of switches S51 to S54 in response to the digital control signal received through the control terminal 175, and selects at least one of the plurality of voltages V41 to V44 generated by the switched-capacitor circuit 16. The output switching circuit 17 outputs the selected voltage.

The configuration of the output switching circuit 17 illustrated in FIG. 6 is an example. It is noted that the configuration of the output switching circuit 17 is not limited to the configuration illustrated in FIG. 6. In particular, the switches S51 to S54 may have any configuration as long as any one of the four input terminals 171 to 174 can be selected and connected to the output terminal 170. For example, the output switching circuit 17 may further include a switch connected between a set of the switches S51 to S53 and a set of the switch S54 and the output terminal 170. For example, the output switching circuit 17 may further include a switch connected between a set of the switches S51 and S52 and a set of the switches S53 and S54 and the output terminal 170.

For example, in the case of selecting one voltage from among voltages of two discrete voltage levels, it is sufficient that the output switching circuit 17 include at least the switches S52 and S53.

Moreover, the output switching circuit 17 can be configured to output two or more voltages. In this case, it is sufficient that the output switching circuit 17 further include a necessary number of additional switch sets similar to the set of the switches S51 to S54 and additional output terminals.

The switches included in the output switching circuit 17 are included in the tracker 3. Specifically, the tracker 3 includes the plurality of switches S51 to S54.

(5.4) Pre-Regulator Circuit

Next, the circuit configuration of the pre-regulator circuit 15 will be described. As illustrated in FIG. 6, the pre-regulator circuit 15 includes an input terminal 150, a plurality of (e.g., four in the illustrated example) output terminals 151 to 154, a plurality of inductor connection terminals 155 and 156, a control terminal 157, a plurality of (e.g., five in the illustrated example) switches S61, S62, S63, S71, and S72, a power inductor L71, and a plurality of capacitors C61, C62, C63, and C64.

The input terminal 150 is an input terminal for a DC voltage. Specifically, the input terminal 150 is a terminal for receiving an input voltage from the DC power supply 18 (see FIG. 5).

The output terminal 151 is an output terminal for the voltage V44. Specifically, the output terminal 151 is a terminal for supplying the voltage V44 to the switched-capacitor circuit 16. The output terminal 151 is connected to the node N4 of the switched-capacitor circuit 16.

The output terminal 152 is an output terminal for the voltage V43. Specifically, the output terminal 152 is a terminal for supplying the voltage V43 to the switched-capacitor circuit 16. The output terminal 152 is connected to the node N3 of the switched-capacitor circuit 16.

The output terminal 153 is an output terminal for the voltage V42. Specifically, the output terminal 153 is a terminal for supplying the voltage V42 to the switched-capacitor circuit 16. The output terminal 153 is connected to the node N2 of the switched-capacitor circuit 16.

The output terminal 154 is an output terminal for the voltage V41. Specifically, the output terminal 154 is a terminal for supplying the voltage V41 to the switched-capacitor circuit 16. The output terminal 154 is connected to the node N1 of the switched-capacitor circuit 16.

As further shown, the inductor connection terminal 155 is connected to one end (first end) of the power inductor L71. The inductor connection terminal 156 is connected to the other end (second end) of the power inductor L71.

The control terminal 157 is an input terminal for a digital control signal. Specifically, the control terminal 157 is a terminal for receiving a digital control signal for controlling the pre-regulator circuit 15.

The switch S71 is connected between the input terminal 150 and the one end (first end) of the power inductor L71. Specifically, the switch S71 has a first terminal connected to the input terminal 150, and a second terminal connected to the one end of the power inductor L71 via the inductor connection terminal 155. In this connection configuration, ON/OFF switching of the switch S71 enables switching between connection and disconnection between the input terminal 150 and the one end of the power inductor L71.

The switch S72 is connected between the one end (first end) of the power inductor L71 and the ground. Specifically, the switch S72 has a first terminal connected to the one end of the power inductor L71 via the inductor connection terminal 155, and a second terminal connected to the ground. In this connection configuration, ON/OFF switching of the switch S72 enables switching between connection and disconnection between the one end of the power inductor L71 and the ground.

The switch S61 is connected between the other end (second end) of the power inductor L71 and the output terminal 151. Specifically, the switch S61 has a first terminal connected to the other end of power inductor L71, and a second terminal connected to the output terminal 151. In this connection configuration, ON/OFF switching of the switch S61 enables switching between connection and disconnection between the other end of the power inductor L71 and the output terminal 151.

The switch S62 is connected between the other end (second end) of the power inductor L71 and the output terminal 152. Specifically, the switch S62 has a first terminal connected to the other end of power inductor L71, and a second terminal connected to the output terminal 152. In this connection configuration, ON/OFF switching of the switch S62 enables switching between connection and disconnection between the other end of the power inductor L71 and the output terminal 152.

The switch S63 is connected between the other end (second end) of the power inductor L71 and the output terminal 153. Specifically, the switch S63 has a first terminal connected to the other end of power inductor L71, and a second terminal connected to the output terminal 153. In this connection configuration, ON/OFF switching of the switch S63 enables switching between connection and disconnection between the other end of the power inductor L71 and the output terminal 153.

The capacitor C61 is connected between the output terminal 151 and the output terminal 152. One of the two electrodes (first electrode) of the capacitor C61 is connected to the switch S61 and the output terminal 151, and the other of the two electrodes (second electrode) of the capacitor C61 is connected to the switch S62, the output terminal 152, and one of the two electrodes (first electrode) of the capacitor C62.

The capacitor C62 is connected between the output terminal 152 and the output terminal 153. The one of the two electrodes (first electrode) of the capacitor C62 is connected to the switch S62, the output terminal 152, and the other of the two electrodes (second electrode) of the capacitor C61, and the other of the two electrodes (second electrode) of the capacitor C62 is connected to the switch S63, the output terminal 153, and one of the two electrodes of the capacitor C63.

The capacitor C63 is connected between the output terminal 153 and the output terminal 154. The one of the two electrodes (first electrode) of the capacitor C63 is connected to the switch S63, the output terminal 153, and the other of the two electrodes (second electrode) of the capacitor C62, and the other of the two electrodes (second electrode) of the capacitor C63 is connected to the output terminal 154 and one of the two electrodes (first electrode) of the capacitor C64.

The capacitor C64 is connected between the output terminal 154 and the ground. The one of the two electrodes (first electrode) of the capacitor C64 is connected to the output terminal 154 and the other of the two electrodes (second electrode) of the capacitor C63, and the other of the two electrodes (second electrode) of the capacitor C64 is connected to the ground.

In operation, the plurality of switches S61 to S63 are controlled so as to be exclusively turned ON. In other words, only any one of the switches S61 to S63 is turned ON, and the others are turned OFF. Turning ON of any one of the switches S61 to S63 enables the levels of the voltages V41 to V44 to be changed.

The pre-regulator circuit 15 configured as described above supplies electric charge to the switched-capacitor circuit 16 via at least one of the plurality of output terminals 151 to 154.

The switches included in the pre-regulator circuit 15 are mounted in the tracker 3. Specifically, the tracker 3 includes the plurality of switches S61 to S63, S71, and S72.

(6) Individual Components of RF Module

Hereinafter, the individual components of the RF module 7 according to the first exemplary embodiment will be described with reference to the drawings.

(6.1) PA Module

As illustrated in FIG. 2, the PA module 8 includes the tracker module 1, the PA 81, and a control circuit 82.

The PA module 8 is an amplifier circuit that amplifies the power of an RF signal output from an RF signal processing circuit 94, which will be described below, to a level necessary for transmitting the RF signal to a base station (not illustrated), and outputs the amplified RF signal.

(6.1.1) PA

The PA 81 illustrated in FIG. 2 includes, although not illustrated, a transistor (e.g., an amplifier element), a bias circuit, a resistor, an input matching circuit, and an output matching circuit.

The PA 81 herein is a PA that amplifies a frequency division duplex (FDD) transmission signal. More specifically, the PA 81 is a PA that amplifies a transmission signal whose communication band is the mid band and a transmission signal whose communication band is the high band. The PA 81 amplifies, as transmission signals whose communication band is the high band, a transmission signal whose communication band is Band 30 and a transmission signal whose communication band is n41.

(6.1.2) Transistor

The transistor (not illustrated) of the PA 81 illustrated in FIG. 2 is, for example, an NPN transistor, and is an amplifier element that amplifies an RF signal by being supplied with the power supply voltage V1. In operation, the transistor amplifies an RF signal output from the RF signal processing circuit 94. The transistor has a base connected to an output terminal of the input matching circuit (not illustrated). Moreover, the base of the transistor may be electrically connected to the output terminal of the input matching circuit via a capacitor (not illustrated). The transistor has a collector electrically connected to the variable low pass filter 4 of the tracker module 1. The transistor has an emitter that is at a ground potential.

The transistor is supplied with the power supply voltage V1. The base of the transistor receives an RF signal output from the input matching circuit. In addition, the base of the transistor is connected to the bias circuit (not illustrated) via the resistor (not illustrated), and a predetermined bias current is superimposed on the RF signal output from the input matching circuit. The tracker module 1 is connected to the collector of the transistor. To the collector of the transistor, the power supply voltage V1 controlled in accordance with the amplitude level of the RF signal is applied from the tracker module 1. The collector of the transistor is connected to the filter 71 via the output matching circuit (not illustrated).

The ET method is used here as described above, and thus the amplitude level of the power supply voltage V1 changes in accordance with amplitude variations of the RF signal.

(6.1.3) Bias Circuit

The bias circuit (not illustrated) of the PA 81 illustrated in FIG. 2 is a circuit configured to bias the transistor (not illustrated) of the PA 81 to an operating point. In an exemplary aspect, the bias circuit includes, for example, a transistor such as a heterojunction bipolar transistor (HBT).

The bias circuit is connected to the base of the transistor that amplifies an RF signal. More specifically, the bias circuit has an output terminal connected between the output terminal of the input matching circuit and the base of the transistor. The bias circuit is configured to supply a bias (e.g., a bias current) to the base of the transistor.

Although not illustrated, for example, a battery voltage supplied from the battery of the communication device 9 or the like equipped with the RF module 7 is applied to the collector of the transistor included in the bias circuit. The emitter of the transistor included in the bias circuit is connected to the base of the transistor that amplifies an RF signal. It is noted that the bias circuit is not limited to the above-described configuration, and can have another configuration as long as it is configured to bias the transistor that amplifies an RF signal to an operating point.

(6.1.4) Input Matching Circuit

The input matching circuit (not illustrated) of the PA 81 illustrated in FIG. 2 is connected to the input side of the transistor, and serves as a matching circuit for achieving the matching between the output impedance of a circuit on the input side of the transistor (for example, the RF signal processing circuit 94) and the input impedance of the transistor. The input matching circuit includes, for example, at least one of an inductor and a capacitor.

(6.1.5) Output Matching Circuit

The output matching circuit (not illustrated) of the PA 81 illustrated in FIG. 2 is connected to the output side of the transistor, and serves as a matching circuit for achieving the matching between the output impedance of the transistor and the input impedance of a circuit on the output side of the transistor (for example, the filter 71). The output matching circuit includes, for example, at least one of an inductor and a capacitor.

(6.1.6) Control Circuit

As illustrated in FIG. 2, the control circuit 82 controls the PA 81. More specifically, the control circuit 82 controls the bias circuit of the PA 81.

(6.2) Filter

As illustrated in FIG. 2, the filter 71 is a transmission filter of a communication band that allows an RF signal to pass therethrough. The filter 71 is disposed, on a transmission path, between the PA module 8 and the antenna terminal 74. More specifically, the filter 71 is disposed on a path between the PA module 8 and the switch 72. The filter 71 allows an RF signal having power amplified by the PA module 8 and output from the PA module 8 to pass therethrough. The transmission path is a path connecting the input terminal 73 and the antenna terminal 74 for transmitting an RF signal from the antenna 91.

It is noted that the filter 71 is not limited to a transmission filter, and can be a duplexer including both a transmission filter and a reception filter, or may be a multiplexer including three or more filters.

(6.3) Switch

As illustrated in FIG. 2, the switch 72 is a switch for switching the path to be connected to the antenna terminal 74. In other words, the switch 72 is a switch for switching the filter to be connected to the antenna terminal 74 among a plurality of filters including the filter 71.

The switch 72 has a common terminal 721 and a plurality of (two in the illustrated example) selection terminals 722 and 723. The common terminal 721 is connected to the antenna terminal 74. The selection terminal 722 is connected to the filter 71. The selection terminal 723 is connected to another filter (not illustrated) different from the filter 71.

The switch 72 is, for example, a switch configured for connecting any one of the plurality of selection terminals 722 and 723 to the common terminal 721. The switch 72 is, for example, a switch integrated circuit (IC). In addition, the switch 72 can be controlled, for example, by the signal processing circuit 92, which will be described below. The switch 72 switches the connection state between the common terminal 721 and the plurality of selection terminals 722 and 723 in response to a control signal from the RF signal processing circuit 94 of the signal processing circuit 92. The switch 72 can be a switch that simultaneously connects the plurality of selection terminals 722 and 723 to the common terminal 721. In this case, the switch 72 is a switch configured for one-to-many connection.

(6.4) Antenna Terminal

As illustrated in FIG. 2, the antenna terminal 74 is a terminal connected to the antenna 91, which will be described below. An RF signal from the RF module 7 is output to the antenna 91 via the antenna terminal 74. Although not illustrated, an RF signal from the antenna 91 is output to the RF module 7 via the antenna terminal 74. The antenna terminal 74 is a terminal through which an RF signal passes.

(7) Individual Components of Communication Device

Hereinafter, the individual components of the communication device 9 according to the first exemplary embodiment will be described with reference to the drawings.

(7.1) Antenna

As illustrated in FIG. 2, the antenna 91 is connected to the antenna terminal 74 of the RF module 7. The antenna 91 has a radiation function of radiating an RF signal (e.g., a transmission signal) output from the RF module 7 as a radio wave, and a reception function of receiving an RF signal (e.g., a reception signal) as a radio wave from the outside and outputting the received RF signal to the RF module 7.

(7.2) Signal Processing Circuit

As illustrated in FIG. 2, the signal processing circuit 92 includes a baseband signal processing circuit 93 and the RF signal processing circuit 94. The signal processing circuit 92 outputs an RF signal to the RF module 7.

The baseband signal processing circuit 93 is, for example, a baseband integrated circuit (BBIC), and performs signal processing on an RF signal. The RF signal has a frequency of around several hundred MHz to several GHz, for example.

The baseband signal processing circuit 93 generates an I-phase signal and a Q-phase signal from a baseband signal. The baseband signal is, for example, an audio signal, an image signal, or the like received from the outside. The baseband signal processing circuit 93 combines the I-phase signal and the Q-phase signal to perform IQ modulation processing, and outputs a transmission signal. At this time, the transmission signal is generated as a modulated signal (e.g., an IQ signal), which is obtained through amplitude modulation performed on a carrier signal of a predetermined frequency in a period longer than the period of the carrier signal. The modulated signal is output as an IQ signal from the baseband signal processing circuit 93. The IQ signal is a signal whose amplitude and phase are represented on an IQ plane. The IQ signal has a frequency of around several MHz to several hundred MHz, for example.

As described above, an envelope signal is a signal indicating the envelope value of a modulated wave (e.g., an RF signal). The envelope value is, for example, $(I^2+Q^2)^{1/2}$. (I, Q) represents a constellation point herein. The constellation point is a point representing, on a constellation diagram, a signal modulated by digital modulation.

The RF signal processing circuit 94 is, for example, a radio frequency integrated circuit (RFIC), and performs signal processing on an RF signal. For example, the RF signal processing circuit 94 performs predetermined signal processing on the modulated signal (e.g., the IQ signal) output from the baseband signal processing circuit 93. More specifically, the RF signal processing circuit 94 performs signal processing such as up-conversion on the modulated signal output from the baseband signal processing circuit 93, and outputs the RF signal generated through the signal processing to the PA module 8. The signal processing performed by the RF signal processing circuit 94 is not limited to direct conversion from the modulated signal into the RF signal. The RF signal processing circuit 94 may convert the modulated signal into an intermediate frequency (IF) signal, and generate an RF signal from the IF signal obtained through the conversion.

The signal processing circuit 92 outputs a power supply control signal to the tracker 3 of the tracker module 1. The power supply control signal is a signal including information regarding amplitude variations of an RF signal, and is output from the signal processing circuit 92 to the tracker module 1 in order to change the amplitude of the power supply voltage V1. The power supply control signal includes, for example, an I-phase signal and a Q-phase signal.

(8) Operation of Tracker Module

Next, the operation of the tracker module 1 according to the first embodiment will be described with reference to the drawings. The PA 81 that is supplied with a power supply voltage from the tracker 3 supports a first communication band and a second communication band.

The tracker 3 outputs the power supply voltage V1. Moreover, the variable low pass filter 4 allows the power supply voltage V1 from the tracker 3 to pass therethrough. The variable low pass filter 4 reduces harmonic components of the power supply voltage V1. Specifically, the variable low pass filter 4 is configured to cut harmonic components of the power supply voltage V1 and allows fundamental wave components of the power supply voltage V1 to pass therethrough. Thereafter, the power supply voltage V1 that has passed through the variable low pass filter 4 is applied to the PA 81.

At this time, the characteristics of the variable low pass filter 4 are changed for each communication band. In the case of the first communication band, the switch 61 of the second block 6 causes the common terminal 611 and the selection terminal 612 to be connected to each other. That is, the series circuit of the inductor 52 and the capacitor 53 is connected to the ground. On the other hand, in the case of the second communication band, the switch 61 of the second block 6 causes the common terminal 611 and the selection terminal 613 to be connected to each other. That is, the distal end of the series circuit of the inductor 52 and the capacitor 53 is opened.

Figure 4:
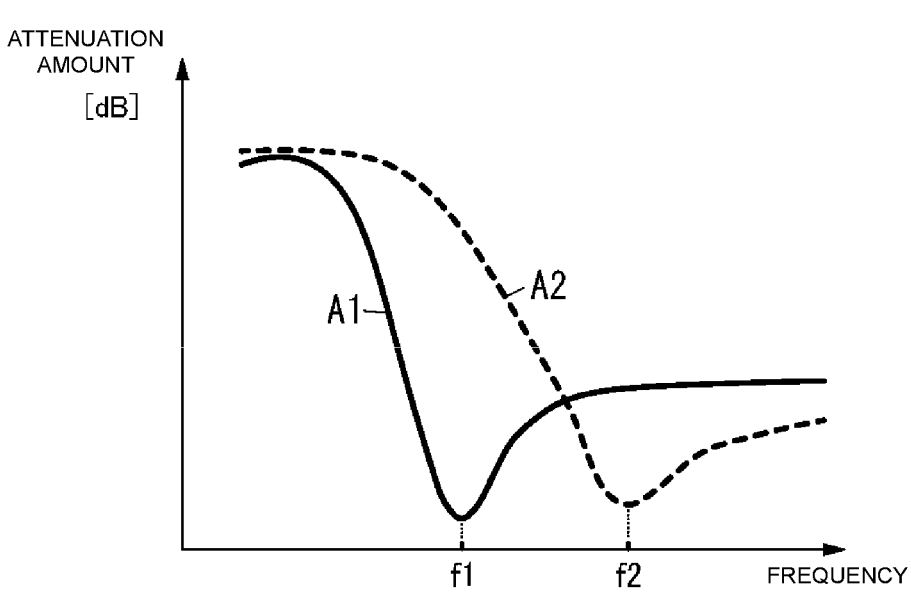
FIG. 4 is a graph illustrating the characteristics of a variable low pass filter of the tracker module according to the first exemplary embodiment.

Such switching of the switch 61 of the second block 6 of the variable low pass filter 4 makes it possible to switch between characteristic A1 and characteristic A2 as illustrated in FIG. 4. In other words, the attenuation pole can be changed between frequencies f1 and f2.

In a case where the PA 81 amplifies an FDD transmission signal, harmonic components of the power supply voltage V1 can be reduced by the variable low pass filter 4, and thus noise to an FDD reception signal can be reduced.

(9) Advantageous Effects

In the tracker module 1 according to the first exemplary embodiment, the variable low pass filter 4 is disposed between the tracker 3 and the external connection terminal 12 to which the PA 81 is connected. Accordingly, when the PA 81 supports transmission signals of a plurality of communication bands, the attenuation pole of the variable low pass filter 4 can be changed in accordance with each communication band, and thus both low loss and a favorable attenuation characteristic can be achieved in each communication band.

(10) Modifications

(10.1) First Modification

In a first modification of the first embodiment, in the second block 6 of the variable low pass filter 4, the selection terminal 613 of the switch 61 is not limited to being connected to nothing, that is, being open, and may be connected to the output of the power supply voltage V1, for example.

(10.2) Second Modification

In a second modification of the first embodiment, the entire variable low pass filter 4 may be integrated with the tracker 3 into one package. More specifically, not only the switch 61 of the second block 6 of the variable low pass filter 4, but also the first block 5 of the variable low pass filter 4 may be integrated with the tracker 3 into one package.

(10.3) Third modification

Figure 7:
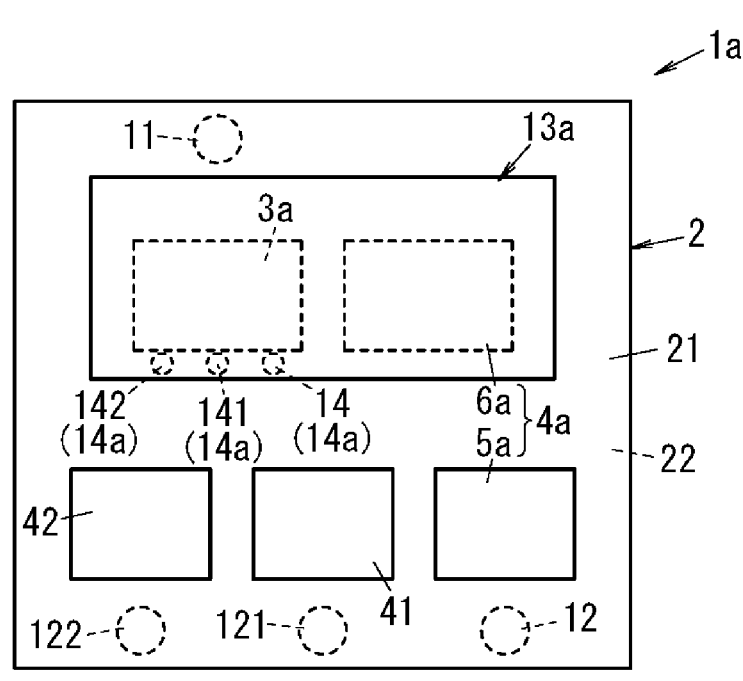
FIG. 7 is a plan view of a tracker module according to a second exemplary embodiment.
Figure 8:
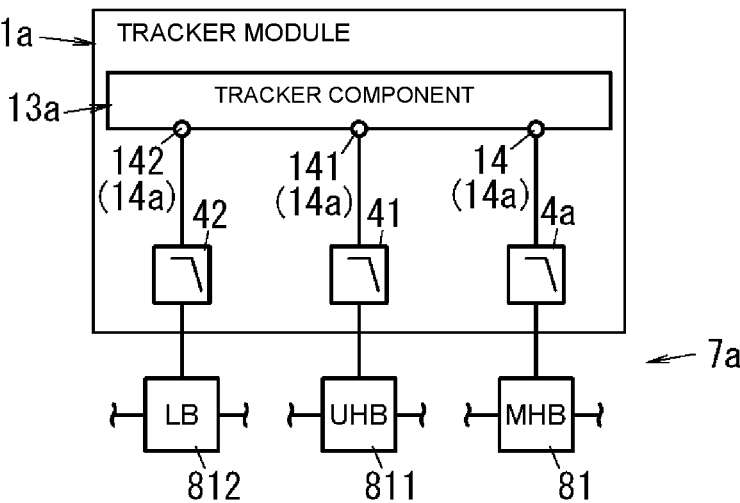
FIG. 8 is a conceptual diagram illustrating the configurations of the tracker module and an RF module according to the second exemplary embodiment.

In a third modification of the first embodiment, the tracker module 1 may further include a plurality of output terminals 14a of the second embodiment (see FIG. 7 and FIG. 8). In the tracker module 1 according to the third modification, the plurality of output terminals 14a are integrated with the tracker 3 into one package. The plurality of output terminals 14a include a first output terminal 14 and a plurality of second output terminals 141 and 142. The first output terminal 14 is connected to the variable low pass filter 4. The second output terminal 141 is connected to a low pass filter 41 (see FIG. 7 and FIG. 8) disposed separately from the tracker 3. The second output terminal 142 is connected to a low pass filter 42 (see FIG. 7 and FIG. 8) disposed separately from the tracker 3.

Second Exemplary Embodiment

A tracker module 1a according to the second exemplary embodiment is different from the tracker module 1 according to the first embodiment (see FIG. 1 and FIG. 2) in that a tracker 3a is configured to supply a power supply voltage V1 to a plurality of PAs 81, 811, and 812, as illustrated in FIG. 7 and FIG. 8.

Configuration

As illustrated in FIG. 7 and FIG. 8, the tracker module 1a according to the second embodiment includes a substrate 2, the tracker 3a, and a variable low pass filter 4a. The tracker module 1a also includes an input terminal 11, a plurality of (three in the illustrated example) external connection terminals 12, 121, and 122, and a plurality of (three in the illustrated example) output terminals 14a. Regarding the tracker module 1a according to the second embodiment, the components similar to those of the tracker module 1 according to the first embodiment are denoted by the same reference numerals, and the description thereof will be omitted.

Input Terminal, External Connection Terminal, Output Terminal

The input terminal 11 is connected to the signal processing circuit 92 (see FIG. 2), and receives a power supply control signal from the signal processing circuit 92, similarly to the input terminal 11 of the first embodiment (see FIG. 1).

As illustrated in FIG. 7 and FIG. 8, the external connection terminal 12 is connected to the PA 81, similarly to the external connection terminal 12 of the first embodiment (see FIG. 1). The external connection terminal 121 is connected to the PA 811. The external connection terminal 122 is connected to the PA 812.

As illustrated in FIG. 7, the plurality of output terminals 14a are integrated with the tracker 3a into one package, similarly to the output terminal 14 of the first embodiment (see FIG. 1). The plurality of output terminals 14a include a first output terminal 14 and a plurality of (two in the illustrated example) second output terminals 141 and 142. The variable low pass filter 4a is connected to the first output terminal 14. A low pass filter 41 is connected to the second output terminal 141. A low pass filter 42 is connected to the second output terminal 142. The low pass filters 41 and 42 are disposed separately from the tracker 3a.

Tracker

As illustrated in FIG. 7 and FIG. 8, the tracker 3a is configured to supply the power supply voltage V1 to the PA 81. More specifically, the tracker 3a extracts an envelope from a modulated signal of an RF signal, generates the power supply voltage V1 having a level corresponding to the envelope, and supplies the power supply voltage V1 to the PA 81. Furthermore, the tracker 3a is configured to supply a power supply voltage to the PAs 811 and 812.

The tracker 3a includes an input terminal (not illustrated) that receives a power supply control signal, and a voltage generator (not illustrated) that generates the power supply voltage V1, similarly to the tracker 3 of the first embodiment. The tracker 3a generates the power supply voltage V1 in response to the power supply control signal received by the input terminal. Also in the second embodiment, similarly to the first embodiment, an RF module 7a amplifies an RF signal by using the ET method, and thus the tracker 3a of the second embodiment outputs the power supply voltage V1.

Variable Low Pass Filter

Figure 9:
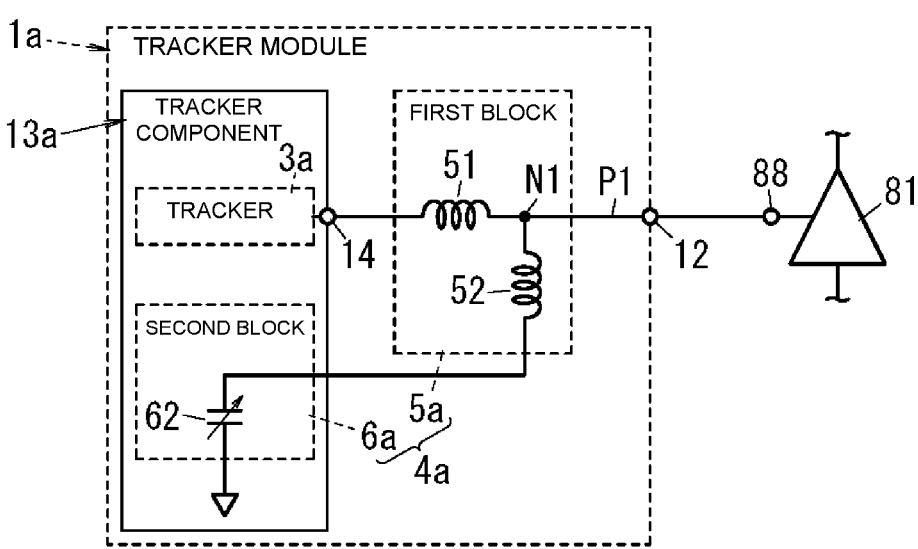
FIG. 9 is a conceptual diagram illustrating a main part of the tracker module according to the second exemplary embodiment.

As illustrated in FIG. 9, the variable low pass filter 4a is disposed on a path P1 between the tracker 3a and the PA 81. The variable low pass filter 4a reduces harmonic components of the power supply voltage V1, similarly to the variable low pass filter 4 of the first embodiment (see FIG. 1). Accordingly, noise resulting from the power supply voltage V1 can be reduced.

As illustrated in FIG. 9, the variable low pass filter 4a includes a first block 5a and a second block 6a.

In this exemplary aspect, the first block 5a includes at least one electronic component. More specifically, the first block 5a includes two inductors 51 and 52 as electronic components. The inductor 51 is disposed on the path P1 between the tracker 3a and the external connection terminal 12. The inductor 52 is connected to a node N1 on the path P1. Each of the inductors 51 and 52 is a mount component mounted on a first main surface 21 of the substrate 2.

The second block 6a includes a digitally tunable capacitor (DTC) 62, which can be a variable capacitor having a variable capacitance. A first end of the DTC 62 is connected in series to the inductor 52, and a second end of the DTC 62 is connected to the ground.

The second block 6a is integrated with the tracker 3a into one package. Specifically, the tracker 3a and the second block 6a form a tracker component 13a in this aspect.

Disposition Relationship Among Tracker, Low Pass Filter, and External Connection Terminal In the tracker module 1a described above, the tracker 3a and the variable low pass filter 4a are disposed on or in the substrate 2, as illustrated in FIG. 7. More specifically, the tracker 3a and the variable low pass filter 4a are disposed on the first main surface 21 of the substrate 2. Similarly to the variable low pass filter 4a, the low pass filters 41 and 42 are disposed on the first main surface 21 of the substrate 2. On the other hand, the external connection terminal 12 is disposed on a second main surface 22 of the substrate 2. Similarly to the external connection terminal 12, the two external connection terminals 121 and 122 are disposed on the second main surface 22 of the substrate 2. As described above, the tracker 3a and the second block 6a of the variable low pass filter 4a are integrated into one package as the tracker component 13a.

In the second embodiment, the tracker component 13a including the tracker 3a is disposed adjacent to the first block 5a of the variable low pass filter 4a on or in the substrate 2. More specifically, at least one of the plurality of electronic components included in the first block 5a (e.g., the inductors 51 and 52) is disposed adjacent to the tracker 3a.

(2) Operation of Tracker Module

Next, the operation of the tracker module 1a according to the second exemplary embodiment will be described with reference to the drawings. The PA 81 that is supplied with a power supply voltage from the tracker 3a supports a first communication band, a second communication band, and a third communication band.

The tracker 3a outputs the power supply voltage V1. The variable low pass filter 4a allows the power supply voltage V1 from the tracker 3a to pass therethrough. The variable low pass filter 4a reduces harmonic components of the power supply voltage V1. Specifically, the variable low pass filter 4a cuts harmonic components of the power supply voltage V1 and allows fundamental wave components of the power supply voltage V1 to pass therethrough. Thereafter, the power supply voltage V1 that has passed through the variable low pass filter 4a is applied to the PA 81.

At this time, the characteristics of the variable low pass filter 4a are changed for each communication band. The capacitance of the DTC 62 of the second block 6a is changed for each communication band. More specifically, the capacitance of the DTC 62 is made different among when the communication band is the first communication band, when the communication band is the second communication band, and when the communication band is the third communication band.

Figure 10:
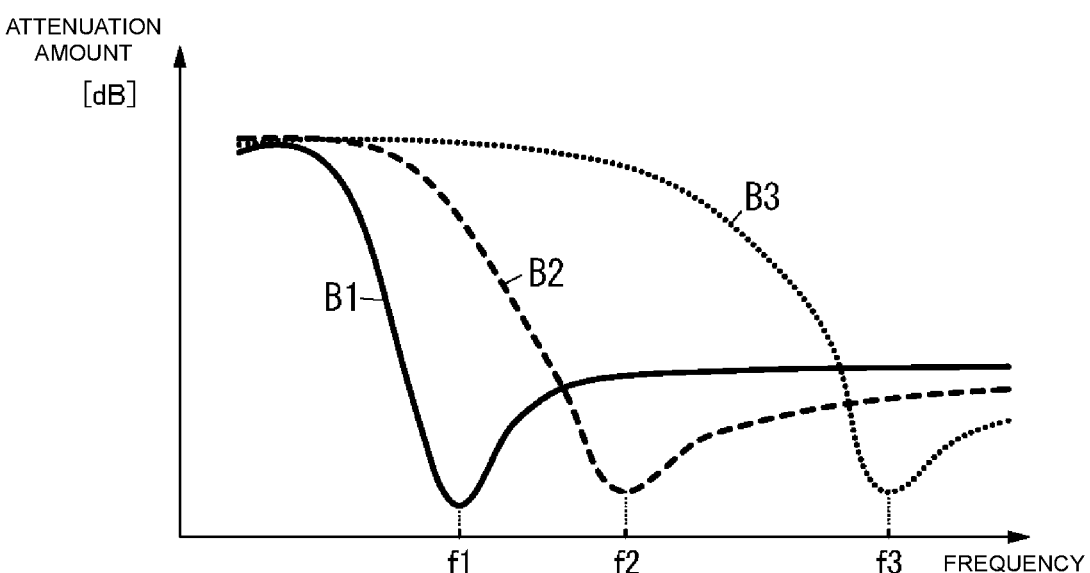
FIG. 10 is a graph illustrating the characteristics of a variable low pass filter of the tracker module according to the second exemplary embodiment.

Such changes of the capacitance of the DTC 62 of the second block 6a of the variable low pass filter 4a make it possible to switch among characteristic B1, characteristic B2, and characteristic B3 as illustrated in FIG. 10. In other words, the attenuation pole can be changed among frequencies f1, f2, and f3.

(3) Advantageous Effects

Also in the tracker module 1a according to the second embodiment, as in the tracker module 1 according to the first embodiment, the attenuation pole of the variable low pass filter 4a can be changed for each communication band, and thus both low loss and a favorable attenuation characteristic are achieved in each communication band.

In the tracker module 1a according to the second embodiment, the tracker 3a includes, as the plurality of output terminals 14a, the first output terminal 14 connected to the variable low pass filter 4a and the second output terminals 141 and 142 connected to the low pass filters 41 and 42 disposed separately from the tracker 3a. Accordingly, when the function of varying the capacitance is not required, loss can be reduced and thus efficiency can be increased.

Third Exemplary Embodiment

Figure 11:
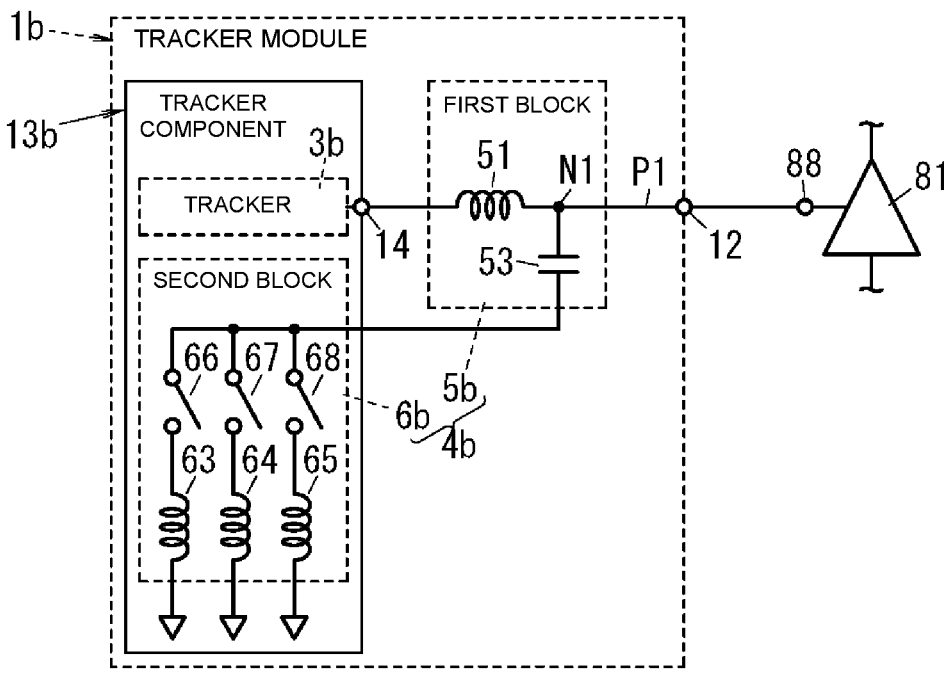
FIG. 11 is a conceptual diagram illustrating a main part of a tracker module according to a third exemplary embodiment.

A tracker module 1b according to the third exemplary embodiment is different from the tracker module 1 according to the first embodiment (see FIG. 3) in that the tracker module 1b has the configuration illustrated in FIG. 11.

Configuration

As illustrated in FIG. 11, the tracker module 1b according to the third embodiment includes a tracker 3b and a variable low pass filter 4b. Regarding the tracker module 1b according to the third embodiment, the components similar to those of the tracker module 1 according to the first embodiment are denoted by the same reference numerals, and the description thereof will be omitted.

Tracker

As illustrated in FIG. 11, the tracker 3b is configured to supply a power supply voltage V1 to a PA 81. More specifically, the tracker 3b extracts an envelope from a modulated signal of an RF signal, generates the power supply voltage V1 having a level corresponding to the envelope, and supplies the power supply voltage V1 to the PA 81.

The tracker 3*b* includes an input terminal (not illustrated) that receives a power supply control signal, and a voltage generator (not illustrated) that generates the power supply voltage V1, similarly to the tracker 3 of the first embodiment. The tracker 3*b* generates the power supply voltage V1 in response to the power supply control signal received by the input terminal. Also in the third embodiment, as in the first embodiment, the RF module 7 amplifies an RF signal by using the ET method, and thus the tracker 3*b* outputs the power supply voltage V1.

Variable Low Pass Filter

As illustrated in FIG. 11, the variable low pass filter 4*b* is disposed on a path P1 between the tracker 3*b* and the PA 81. The variable low pass filter 4*b* reduces harmonic components of the power supply voltage V1, similarly to the variable low pass filter 4 of the first embodiment (see FIG. 3). Accordingly, noise resulting from the power supply voltage V1 can be reduced.

As illustrated in FIG. 11, the variable low pass filter 4*b* includes a first block 5*b* and a second block 6*b*.

The first block 5*b* includes at least one electronic component. More specifically, the first block 5*b* includes an inductor 51 and a capacitor 53. The inductor 51 is disposed on the path P1 between the tracker 3*b* and the external connection terminal 12. The capacitor 53 is connected to a node N1 on the path P1.

The second block 6*b* includes a plurality of (e.g., three in the illustrated example) inductors 63 to 65 and a plurality of (e.g., three in the illustrated example) switches 66 to 68. The plurality of inductors 63 to 65 are connected in parallel to each other. The plurality of inductors 63 to 65 are each connected in series to the capacitor 53. Moreover, the plurality of inductors 63 to 65 correspond one-to-one to the plurality of switches 66 to 68, and are connected in series to the corresponding switches 66 to 68. Specifically, the inductor 63 is connected in series to the switch 66, the inductor 64 is connected in series to the switch 67, and the inductor 65 is connected in series to the switch 68. The series circuits of the inductors 63 to 65 and the switches 66 to 68 are connected to the ground.

Also in the third embodiment, the second block 6*b* is integrated with the tracker 3*b* into one package. Specifically, the tracker 3*b* and the second block 6*b* form a tracker component 13*b*.

Disposition Relationship Among Tracker, Low Pass Filter, and External Connection Terminal In the tracker module 1*b* described above, the tracker 3*b* and the variable low pass filter 4*b* are disposed on or in the substrate 2 (see FIG. 1). More specifically, the tracker 3*b* and the variable low pass filter 4*b* are disposed on the first main surface 21 (see FIG. 1) of the substrate 2. As described above, the tracker 3*b* and the second block 6*b* of the variable low pass filter 4*b* are integrated into one package as the tracker component 13*b*.

The tracker component 13*b* including the tracker 3*b* is disposed adjacent to the first block 5*b* of the variable low pass filter 4*b* on or in the substrate 2. More specifically, at least one of the plurality of electronic components included in the first block 5*b* (the inductor 51 and the capacitor 53) is disposed adjacent to the tracker 3*b*.

(2) Operation of Tracker Module

Next, the operation of the tracker module 1*b* according to the third exemplary embodiment will be described with reference to the drawings. The PA 81 that is supplied with a power supply voltage from the tracker 3*b* supports a first communication band, a second communication band, and a third communication band.

The tracker 3*b* is configured to output the power supply voltage V1. The variable low pass filter 4*b* allows the power supply voltage V1 from the tracker 3*b* to pass therethrough. The variable low pass filter 4*b* reduces harmonic components of the power supply voltage V1. Specifically, the variable low pass filter 4*b* cuts harmonic components of the power supply voltage V1 and allows fundamental wave components of the power supply voltage V1 to pass therethrough. Thereafter, the power supply voltage V1 that has passed through the variable low pass filter 4*b* is applied to the PA 81.

At this time, the characteristics of the variable low pass filter 4*b* are changed for each communication band. ON/OFF of each of the switches 66 to 68 of the second block 6*b* is switched for each communication band. More specifically, the switch in an ON state of the plurality of switches 66 to 68 is made different among when the communication band is the first communication band, when the communication band is the second communication band, and when the communication band is the third communication band.

As described above, as a result of performing ON/OFF switching of the switches 66 to 68 of the second block 6*b* of the variable low pass filter 4*b*, the attenuation pole can be changed among frequencies f1, f2, and f3 (see FIG. 10).

(3) Advantageous Effects

Also in the tracker module 1*b* according to the third embodiment, as in the tracker module 1 according to the first embodiment, the attenuation pole of the variable low pass filter 4*b* can be changed for each communication band, and thus both low loss and a favorable attenuation characteristic can be achieved in each communication band.

(4) Modifications

(4.1) First Modification

In a first modification of the third embodiment, the entire variable low pass filter 4*b* may be integrated with the tracker 3*b* into one package. More specifically, not only the switches 66 to 68 of the second block 6*b* of the variable low pass filter 4*b*, but also the first block 5*b* of the variable low pass filter 4*b* may be integrated with the tracker 3*b* into one package.

(4.2) Second Modification

In a second modification of the third embodiment, the tracker module 1*b* may further include the plurality of output terminals 14*a* of the second embodiment (see FIG. 7 and FIG. 8). In the tracker module 1*b* according to the second modification, the plurality of output terminals 14*a* are integrated with the tracker 3*b* into one package. The plurality of output terminals 14*a* include the first output terminal 14 and the plurality of second output terminals 141 and 142. The first output terminal 14 is connected to the variable low pass filter 4*b*. The second output terminal 141 is connected to the low pass filter 41 (see FIG. 7 and FIG. 8) disposed separately from the tracker 3*b*. The second output terminal 142 is connected to the low pass filter 42 (see FIG. 7 and FIG. 8) disposed separately from the tracker 3*b*.

Fourth Exemplary Embodiment

In a fourth exemplary embodiment, an RF circuit 7*d* will be described with reference to FIG. 12.

Configuration

Figure 12:
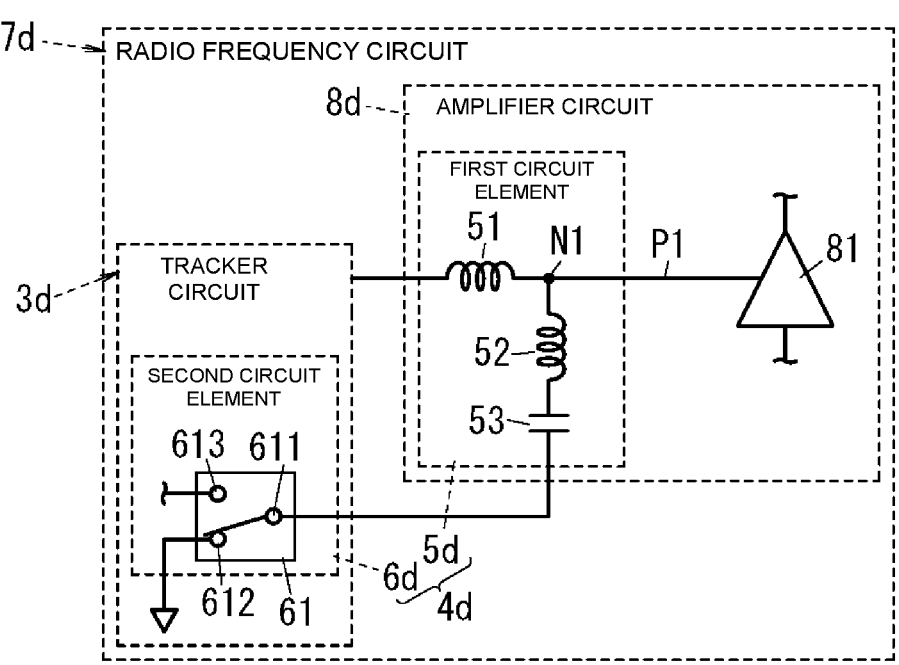
FIG. 12 is a conceptual diagram illustrating the configuration of an RF circuit according to a fourth exemplary embodiment.

As illustrated in FIG. 12, the RF circuit 7*d* according to the fourth embodiment includes a tracker circuit 3*d* and a variable low pass filter 4*d*. The RF circuit 7*d* further includes an amplifier circuit 8*d*.

The tracker circuit 3*d* is configured to apply a power supply voltage V1 to the amplifier circuit 8*d* by using an envelope tracking method.

The amplifier circuit 8*d* includes a PA 81 and is configured to amplify an RF signal.

As illustrated in FIG. 12, the variable low pass filter 4*d* is disposed on a path P1 between the tracker circuit 3*d* and the amplifier circuit 8*d*. The variable low pass filter 4*d* includes a first circuit element 5*d* and a second circuit element 6*d*. The second circuit element 6*d* is different from the first circuit element 5*d*.

The first circuit element 5*d* is included in the amplifier circuit 8*d*. The first circuit element 5*d* includes two inductors 51 and 52 and a capacitor 53. The first circuit element 5*d* may have a circuit configuration other than that described above.

The second circuit element 6*d* is included in the tracker circuit 3*d*. In the fourth embodiment, the second circuit element 6*d* includes a switch 61. The switch 61 switches an operation in accordance with the communication band of an RF signal that passes through the amplifier circuit 8*d*.

(2) Advantageous Effects

With the RF circuit 7*d* according to the fourth embodiment, in a case where the amplifier circuit 8*d* supports transmission signals of a plurality of communication bands, the attenuation pole of the variable low pass filter 4*d* can be changed for each communication band. As a result, both low loss and a favorable attenuation characteristic can be achieved in each of the plurality of communication bands.

(3) Modifications (3.1) First Modification

In a first modification of the fourth embodiment, in the RF circuit 7*d* according to the first modification, the second circuit element 6*d* may include the DTC 62 of the second embodiment (see FIG. 9).

(3.2) Second Modification

In a second modification of the fourth embodiment, in the RF circuit 7*d* according to the second modification, the second circuit element 6*d* may include the inductors 63 to 65 of the third embodiment (see FIG. 11). More specifically, the second circuit element 6*d* may include the plurality of inductors 63 to 65 and the plurality of switches 66 to 68 (see FIG. 11).

The embodiments and modifications described above are merely some of various embodiments and modifications of the present invention. The embodiments and modifications can be variously changed according to design or the like as long as the object of the present invention can be achieved.

Exemplary Aspects

The specification discloses the following exemplary aspects.

A tracker module (1; la; 1*b*) according to a first aspect includes an external connection terminal (12), a tracker (3; 3*a*; 3*b*), and a variable low pass filter (4; 4*a*; 4*b*). The external connection terminal (12) is connected to a power amplifier (81). The tracker (3; 3*a*; 3*b*) is configured to supply a power supply voltage (V1) to the power amplifier (81) via the external connection terminal (12) by using an envelope tracking method. The variable low pass filter (4; 4*a*; 4*b*) is disposed on a path (P1) between the tracker (3; 3*a*; 3*b*) and the external connection terminal (12).

With the tracker module (1; la; 1*b*) according to the first aspect, when the power amplifier (81) supports transmission signals of a plurality of communication bands, the attenuation pole of the variable low pass filter (4; 4*a*; 4*b*) can be changed for each communication band. As a result, both low loss and a favorable attenuation characteristic are achieved in each of the plurality of communication bands.

In the tracker module (1; la; 1*b*) according to the first aspect, the variable low pass filter (4; 4*a*; 4*b*) includes a first block (5; 5*a*; 5*b*) and a second block (6; 6*a*; 6*b*). The first block (5; 5*a*; 5*b*) includes at least one electronic component. The second block (6; 6*a*; 6*b*) is a block configured to vary a cutoff frequency of the variable low pass filter (4; 4*a*; 4*b*). The second block (6; 6*a*; 6*b*) and the tracker (3; 3*a*; 3*b*) are integrated into one package. The first block (5; 5*a*; 5*b*) and the tracker (3; 3*a*; 3*b*) are disposed separately from each other.

With the tracker module (1; la; 1*b*) according to the first aspect, low loss and a favorable attenuation characteristic are effectively obtained.

A tracker module (la) according to a second aspect, in the first aspect, further includes a substrate (2). The substrate (2) has one main surface (first main surface 21). The first block (5*a*) includes, as the at least one electronic component, an inductor (51; 52) that is a mount component mounted on the one main surface of the substrate (2). The second block (6*a*) includes a variable capacitor (DTC 62) having a variable capacitance.

With the tracker module (la) according to the second aspect, a high Q can be easily obtained by using an inductor of a mount component as the inductor (51; 52). In addition, as a result of integrating the variable capacitor (DTC 62), which is easily manufactured by a semiconductor process, with the tracker (3) into one package, that is, forming it in an IC, low loss can be achieved.

A tracker module (la) according to a third aspect, in the first or second aspect, includes a plurality of output terminals (14*a*). The plurality of output terminals (14*a*) are integrated with the tracker (3*a*) into one package. The plurality of output terminals (14*a*) include a first output terminal (14) and a second output terminal (141; 142). The first output terminal (14) is connected to the variable low pass filter (4*a*). The second output terminal (141; 142) is connected to a low pass filter (41; 42) disposed separately from the tracker (3*a*).

With the tracker module (la) according to the third aspect, when the function of varying the capacitance is not required, loss can be reduced and thus efficiency can be increased.

In a tracker module (1; la; 1*b*) according to a fourth aspect, in any one of the first to third aspects, the external connection terminal (12) is connected to the power amplifier (81), the power amplifier including a power amplifier configured to amplify a frequency division duplex transmission signal.

In a tracker module (1; la; 1b) according to a fifth aspect, in any one of the first to third aspects, the external connection terminal (12) is connected to the power amplifier (81), the power amplifier including a power amplifier configured to amplify a transmission signal whose communication band is a mid-band and a power amplifier configured to amplify a transmission signal whose communication band is a high-band.

In a tracker module (1; la; 1b) according to a sixth aspect, in any one of the first to third aspects, the external connection terminal (12) is connected to the power amplifier (81), the power amplifier including a power amplifier configured to amplify a transmission signal whose communication band is Band 30 and a transmission signal whose communication band is n41.

In a tracker module (1; la; 1b) according to a seventh aspect, in any one of the first to sixth aspects, the variable low pass filter (4; 4a; 4b) is configured to reduce harmonic components of the power supply voltage (V1).

A power amplifier module (8) according to an eighth aspect includes the tracker module (1; la; 1b) according to any one of the first to seventh aspects, and the power amplifier (81).

With the power amplifier module (8) according to the eighth aspect, in the tracker module (1; la; 1b), in a case where the power amplifier (81) supports transmission signals of a plurality of communication bands, the attenuation pole of the variable low pass filter (4; 4a; 4b) can be changed for each communication band. As a result, both low loss and a favorable attenuation characteristic are achieved in each of the plurality of communication bands.

A radio frequency module (7; 7a) according to a ninth aspect includes the tracker module (1; la; 1b) according to any one of the first to seventh aspects, the power amplifier (81), and a filter (71). The filter (71) is configured to allow a radio frequency signal amplified by the power amplifier (81) to pass therethrough.

With the radio frequency module (7; 7a) according to the ninth aspect, in the tracker module (1; la; 1b), in a case where the power amplifier (81) supports transmission signals of a plurality of communication bands, the attenuation pole of the variable low pass filter (4; 4a; 4b) can be changed for each communication band. As a result, both low loss and a favorable attenuation characteristic are achieved in each of the plurality of communication bands.

A communication device (9) according to a tenth aspect includes the radio frequency module (7) according to the ninth aspect and a signal processing circuit (92). The signal processing circuit (92) is configured to output a radio frequency signal to the radio frequency module (7).

With the communication device (9) according to the tenth aspect, in the tracker module (1; la; 1b), in a case where the power amplifier (81) supports transmission signals of a plurality of communication bands, the attenuation pole of the variable low pass filter (4; 4a; 4b) can be changed for each communication band. As a result, both low loss and a favorable attenuation characteristic are achieved in each of the plurality of communication bands.

A tracker module (1; 1b) according to an eleventh aspect includes an external connection terminal (12), a tracker (3; 3b), and a variable low pass filter (4; 4b). The external connection terminal (12) is connected to a power amplifier (81). The tracker (3; 3b) is configured to supply a power supply voltage (V1) to the power amplifier (81) via the external connection terminal (12). The variable low pass filter (4; 4b) is disposed on a path (P1) between the tracker (3; 3b) and the external connection terminal (12). The variable low pass filter (4; 4b) includes a switch (61; 66 to 68). The switch (61; 66 to 68) is integrated with the tracker (3; 3b) into one package.

With the tracker module (1; 1b) according to the eleventh aspect, in a case where the power amplifier (81) supports transmission signals of a plurality of communication bands, the attenuation pole of the variable low pass filter (4; 4b) can be changed for each communication band. As a result, both low loss and a favorable attenuation characteristic are achieved in each of the plurality of communication bands.

With the tracker module (1; 1b) according to the eleventh aspect, low loss and a favorable attenuation characteristic can be effectively obtained.

In a tracker module (1; 1b) according to a twelfth aspect, in the eleventh aspect, the switch (61; 66 to 68) is at least a part of a block (second block 6; 6b) configured to vary a cutoff frequency of the variable low pass filter (4; 4b).

In a tracker module (1; 1b) according to a thirteenth aspect, in the eleventh or twelfth aspect, the variable low pass filter (4; 4b) further includes a block (first block 5; 5b) including at least one electronic component. The block is disposed separately from the tracker (3; 3b).

A tracker module (1; 1b) according to a fourteenth aspect, in the thirteenth aspect, further includes a substrate (2). The substrate (2) has one main surface (first main surface 21). The tracker (3; 3b) is disposed on or in the substrate (2). The block (first block 5; 5b) includes, as a component disposed on or in the substrate (2), at least one of a capacitor (53) and an inductor (51; 52).

In a tracker module (1; 1b) according to a fifteenth aspect, in any one of the eleventh to fourteenth aspects, the tracker (3; 3b) is configured to supply the power supply voltage (V1) to the power amplifier (81) by using an envelope tracking method.

A tracker module (1; 1b) according to a sixteenth aspect, in any one of the eleventh to fourteenth aspects, includes a plurality of output terminals. The plurality of output terminals are integrated with the tracker (3; 3b) into one package. The plurality of output terminals include a first output terminal (14) and a second output terminal (141; 142). The first output terminal (14) is connected to the variable low pass filter (4; 4b). The second output terminal (141; 142) is connected to a low pass filter (41; 42) disposed separately from the tracker (3; 3b).

With the tracker module (1; 1b) according to the sixteenth aspect, in a case where the function of varying the capacitance is not required, loss can be reduced and thus efficiency can be increased.

A radio frequency circuit (7d) according to a seventeenth aspect includes a tracker circuit (3d) and a variable low pass filter (4d). The tracker circuit (3d) is configured to supply a power supply voltage (V1) to an amplifier circuit (8d) by using an envelope tracking method. The variable low pass filter (4d) is disposed on a path (P1) between the tracker circuit (3d) and the amplifier circuit (8d). The variable low pass filter (4d) includes a first circuit element (5d) and a second circuit element (6d). The second circuit element (6d) is different from the first circuit element (5d). The first circuit element (5d) is included in the amplifier circuit (8d). The second circuit element (6d) is included in the tracker circuit (3d).

With the radio frequency circuit (7d) according to the seventeenth aspect, in a case where the amplifier circuit (8d) supports transmission signals of a plurality of communication bands, the attenuation pole of the variable low pass filter (4d) can be changed for each communication band. As a result, both low loss and a favorable attenuation characteristic are achieved in each of the plurality of communication bands.

In a radio frequency circuit (7d) according to an eighteenth aspect, in the seventeenth aspect, the second circuit element (6d) includes a switch (61; 66 to 68).

In a radio frequency circuit (7d) according to a nineteenth aspect, in the eighteenth aspect, the switch (61; 66 to 68) is configured to switch an operation in accordance with a communication band of a radio frequency signal that passes through the amplifier circuit (8d).

In a radio frequency circuit (7d) according to a twentieth aspect, in any one of the seventeenth to nineteenth aspects, the second circuit element (6d) includes an inductor (63 to 65) or a capacitor (DTC 62).

What is claimed:

1. A tracker module comprising:
an external connection terminal connected to a power amplifier;
a tracker configured to supply a power supply voltage to the power amplifier via the external connection terminal by using an envelope tracking method; and
a variable low pass filter disposed between the tracker and the external connection terminal and including:
    a first block that includes at least one electronic component and that is disposed separately from the tracker, and
    a second block that is integrated with the tracker and that is configured to vary a cutoff frequency of the variable low pass filter.

2. The tracker module according to claim 1, further comprising:
a substrate having a first main surface,
wherein the first block includes an inductor as the at least one electronic component that is a mount component mounted on the first main surface of the substrate, and
wherein the second block includes a variable capacitor.

3. The tracker module according to claim 1, further comprising a plurality of output terminals integrated with the tracker into one package and including:
a first output terminal connected to the variable low pass filter, and
a second output terminal connected to a low pass filter disposed separately from the tracker.

4. The tracker module according to claim 1, wherein the external connection terminal is connected to the power amplifier that includes a power amplifier configured to amplify a frequency division duplex transmission signal.

5. The tracker module according to claim 1, wherein the external connection terminal is connected to the power amplifier that includes a power amplifier configured to amplify a transmission signal having a communication band that is a mid band and a power amplifier configured to amplify a transmission signal having a communication band that is a high band.

6. The tracker module according to claim 1, wherein the external connection terminal is connected to the power amplifier that includes a power amplifier configured to amplify a transmission signal having a communication band that is Band 30 and a transmission signal having a communication band is n41.

7. The tracker module according to claim 1, wherein the variable low pass filter is configured to reduce harmonic components of the power supply voltage.

8. A power amplifier module comprising:
the tracker module according to claim 1; and
the power amplifier.

9. A radio frequency module comprising:
the tracker module according to claim 1;
the power amplifier; and
a transmission filter configured to allow a radio frequency signal amplified by the power amplifier to pass therethrough.

10. A communication device comprising:
the radio frequency module according to claim 9; and
a signal processing circuit configured to output a radio frequency signal to the radio frequency module.

11. A tracker module comprising:
an external connection terminal connected to a power amplifier;
a tracker configured to supply a power supply voltage to the power amplifier via the external connection terminal; and
a variable low pass filter disposed between the tracker and the external connection terminal and including a switch that is integrated with the tracker into a single package,
wherein the switch is at least a part of a block configured to vary a cutoff frequency of the variable low pass filter.

12. The tracker module according to claim 11, wherein the variable low pass filter further includes a block including at least one electronic component and that is disposed separately from the tracker.

13. The tracker module according to claim 12, further comprising:
a substrate having a first main surface,
wherein the tracker is disposed on or in the substrate, and
wherein the block includes at least one of a capacitor and an inductor that is component disposed on or in the substrate.

14. The tracker module according to claim 11, wherein the tracker is configured to supply the power supply voltage to the power amplifier by using an envelope tracking method.

15. The tracker module according to claim 11, further comprising:
a plurality of output terminals integrated with the tracker into a single package and including:
    a first output terminal connected to the variable low pass filter, and
    a second output terminal connected to a low pass filter disposed separately from the tracker.

16. A radio frequency circuit comprising:
a tracker circuit configured to supply a power supply voltage to an amplifier circuit by using an envelope tracking method; and
a variable low pass filter that includes:
    a first circuit element that is-included in the amplifier circuit, and a second circuit element included in that includes the tracker circuit and that is different from the first circuit element.

17. The radio frequency circuit according to claim 16, wherein the second circuit element includes a switch.

18. The radio frequency circuit according to claim 17, wherein the switch is configured to switch an operation in accordance with a communication band of a radio frequency signal that passes through the amplifier circuit.

19. The radio frequency circuit according to claim 16, wherein the second circuit element includes an inductor or a capacitor.

* * * * *